United States Patent
Kubota et al.

(10) Patent No.: US 10,593,862 B2
(45) Date of Patent: *Mar. 17, 2020

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Makoto Kubota, Yokohama (JP); Hisato Yabuta, Machida (JP); Shunsuke Murakami, Sheffield (GB); Kaoru Miura, Matsudo (JP); Kanako Oshima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

This patent is subject to a terminal disclaimer.

(21) Appl. No.: 15/105,494

(22) PCT Filed: Dec. 11, 2014

(86) PCT No.: PCT/JP2014/083501
§ 371 (c)(1),
(2) Date: Jun. 16, 2016

(87) PCT Pub. No.: WO2015/093555
PCT Pub. Date: Jun. 25, 2015

(65) Prior Publication Data
US 2016/0315245 A1    Oct. 27, 2016

(30) Foreign Application Priority Data
Dec. 18, 2013  (JP) .................. 2013-261501

(51) Int. Cl.
*H01L 41/187* (2006.01)
*H01L 41/18* (2006.01)
(Continued)

(52) U.S. Cl.
CPC ............ *H01L 41/1871* (2013.01); *B08B 7/02* (2013.01); *B41J 2/14233* (2013.01);
(Continued)

(58) Field of Classification Search
CPC . H01L 41/1871; H01L 41/1878; H01L 41/18; H01L 41/1873; C04B 35/4682;
(Continued)

(56) References Cited

U.S. PATENT DOCUMENTS 7,595,975 B2 * 9/2009 Suzuki ................ C01G 23/002
                                              361/306.1
9,159,903 B2 * 10/2015 Oshima ................ B41J 2/14233
(Continued)

FOREIGN PATENT DOCUMENTS

CN        101717261 A     6/2010
EP         0376508 A1     7/1990
(Continued)

OTHER PUBLICATIONS

Dezhen Xue et al., "Elastic, piezoelectric, and dielectric properties of Ba(Zr0.2Ti0.8) . . .", Journal of Applied Physics, 109, 054110 (2011); doi: 10.1063/1.3549173.

*Primary Examiner* — Matthew E. Hoban
*Assistant Examiner* — Lynne Edmondson
(74) *Attorney, Agent, or Firm* — Canon U.S.A. Inc., IP Division

(57) ABSTRACT

The present invention provides a lead-free piezoelectric material having a high piezoelectric constant over a wide operating temperature region. Therefore, the present invention relates to a piezoelectric material including a perovskite-type metal oxide represented by general formula (1) below as a main component, wherein the average valence, of Sn contained in the general formula (1) lies between 2 and 4.

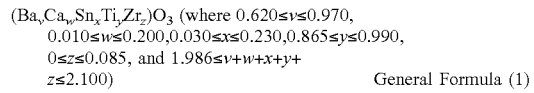

$(Ba_vCa_wSn_xTi_yZr_z)O_3$ (where $0.620 \leq v \leq 0.970$, $0.010 \leq w \leq 0.200, 0.030 \leq x \leq 0.230, 0.865 \leq y \leq 0.990$, $0 \leq z \leq 0.085$, and $1.986 \leq v+w+x+y+z \leq 2.100$)    General Formula (1)

30 Claims, 14 Drawing Sheets

(51) Int. Cl.

| | |
|---|---|
| *C04B 35/468* | (2006.01) |
| *H01L 41/083* | (2006.01) |
| *H02N 2/16* | (2006.01) |
| *C04B 35/49* | (2006.01) |
| *H01L 41/09* | (2006.01) |
| *B41J 2/14* | (2006.01) |
| *B08B 7/02* | (2006.01) |
| *G02B 27/00* | (2006.01) |

(52) U.S. Cl.
CPC ....... *B41J 2/14274* (2013.01); *C04B 35/4682* (2013.01); *C04B 35/49* (2013.01); *G02B 27/0006* (2013.01); *H01L 41/083* (2013.01); *H01L 41/09* (2013.01); *H01L 41/0973* (2013.01); *H02N 2/163* (2013.01); *B41J 2202/03* (2013.01); *C04B 2235/3206* (2013.01); *C04B 2235/3208* (2013.01); *C04B 2235/3215* (2013.01); *C04B 2235/3236* (2013.01); *C04B 2235/3244* (2013.01); *C04B 2235/3248* (2013.01); *C04B 2235/3249* (2013.01); *C04B 2235/3262* (2013.01); *C04B 2235/3293* (2013.01); *C04B 2235/3298* (2013.01); *C04B 2235/5445* (2013.01); *C04B 2235/652* (2013.01); *C04B 2235/6584* (2013.01); *C04B 2235/663* (2013.01); *C04B 2235/765* (2013.01); *C04B 2235/768* (2013.01); *C04B 2235/77* (2013.01); *C04B 2235/785* (2013.01); *C04B 2235/786* (2013.01); *C04B 2235/81* (2013.01)

(58) Field of Classification Search
CPC ...... C04B 2235/3236; C04B 2235/768; C04B 2235/77
USPC ...................... 252/62.9 PZ, 62.9 R; 310/358; 501/135–139
See application file for complete search history.

(56) References Cited

U.S. PATENT DOCUMENTS

| | | | | |
|---|---|---|---|---|
| 9,166,140 | B2* | 10/2015 | Tanaka | H01L 41/0973 |
| 9,190,602 | B2* | 11/2015 | Kubota | H01L 41/083 |
| 9,525,123 | B2* | 12/2016 | Uebayashi | B32B 18/00 |
| 9,722,170 | B2* | 8/2017 | Watanabe | B41J 2/14233 |
| 9,806,251 | B2* | 10/2017 | Kubota | H01L 41/1871 |
| 9,954,161 | B2* | 4/2018 | Kubota | B41J 2/14233 |
| 2008/0145292 | A1 | 6/2008 | Shirakawa | |
| 2009/0128989 | A1* | 5/2009 | Suzuki | C01G 23/002 361/321.4 |
| 2011/0298336 | A1 | 12/2011 | Saito | |
| 2013/0251997 | A1 | 9/2013 | Shirakawa | |
| 2013/0278681 | A1 | 10/2013 | Saito | |

FOREIGN PATENT DOCUMENTS

| | | |
|---|---|---|
| JP | 2003-342077 A | 12/2003 |
| JP | 2009-215111 A | 9/2009 |
| JP | 5217997 B2 | 6/2013 |
| JP | 2013-241326 A | 12/2013 |
| WO | 2008/004393 A1 | 1/2008 |

* cited by examiner

PIEZOELECTRIC MATERIAL, PIEZOELECTRIC ELEMENT, AND ELECTRONIC APPARATUS

CROSS-REFERENCE TO RELATED APPLICATIONS

This application is a National Stage filing of International Application No. PCT/JP2014/083501 filed Dec. 11, 2014, which claims the benefit of Japanese Patent Application No. 2013-261501, filed Dec. 18, 2013, the disclosures of each of which are hereby incorporated by reference herein in their entirety.

TECHNICAL FIELD

The present invention relates to a piezoelectric material and particularly relates to a lead-free piezoelectric material. Also, the present invention relates to a piezoelectric element, a multilayered piezoelectric element, a liquid discharge head, a liquid discharge apparatus, an ultrasonic motor, an optical apparatus, an oscillatory apparatus, a dust removing apparatus, an image pick-up apparatus, and an electronic apparatus, which use the piezoelectric material.

BACKGROUND ART

Piezoelectric materials, are generally $ABO_3$-type perovskite-type metal oxides such as lead zirconate titanate (hereinafter referred to as "PZT"). However, PZT contains lead coordinating at an A-site of a perovskite unit cell. Therefore, the adverse effect of a lead component on the environments is considered as a problem. In order to comply with the problem, a lead-free piezoelectric material and piezoelectric element using a perovskite-type metal oxide are proposed.

Barium titanate ($BaTiO_3$) and derivatives thereof are known as piezoelectric materials composed of lead-tree perovskite oxides. Patent Literature 1 discloses a piezoelectric material in which A-sites of barium titanate are partially substituted by calcium (Ca) and B-sites are partially substituted by manganese (Mn), iron (Fe), or copper (Cu). Patent Literature 1 discloses a piezoelectric material and piezoelectric element which are improved in temperature stability of piezoelectric characteristics near room temperature and mechanical quality factor. Improvement in the mechanical quality factor has the effect of decreasing the heat generated during drive of a piezoelectric element and power consumption. However, the piezoelectric material disclosed in Patent Literature 1 has the problem that the piezoelectric characteristics are degraded as compared with barium titanate unsubstituted by an element such as Ca or the like.

As another example, Patent Literature 2 and Non-Patent Literature 1 disclose piezoelectric materials in which A-sites of barium titanate are partially substituted by calcium (Ca) and B-sites are partially substituted by zirconium (Zr) to improve piezoelectric characteristics. The piezoelectric materials have a low Curie point of as low as 80° C. or less and have the problem of degrading the piezoelectric characteristics due to depolarization in a high-temperature environment in a vehicle in the summer. The piezoelectric characteristics of piezoelectric elements undergoing polarization are generally degraded by depolarization at a temperature 10° C. to 20° C. lower than the Curie temperature. Also, the piezoelectric materials disclosed in Patent Literature 2 have a low mechanical quality factor.

CITATION LIST

Patent Literature

PTL 1 Japanese Patent No. 5217997
PTL 2 Japanese Patent Laid-Open No. 2009-215111

Non Patent Literature

NPL 1 "Journal of Applied Physics" 2011, Vol. 109, 054110-1 to 054110-6

SUMMARY OF INVENTION

Technical Problem

The present invention has been achieved for complying with the above-described problem and provides a lead-free piezoelectric material having a high piezoelectric constant over a wide operating temperature region. Also, the present invention provides a piezoelectric element, a multilayered piezoelectric element, a liquid discharge head, a liquid discharge apparatus, an ultrasonic motor, an optical apparatus, an oscillatory apparatus, a dust removing apparatus, an image-pickup apparatus, and an electronic apparatus, which use the piezoelectric material.

Solution to Problem

A piezoelectric material according to the present invention includes a perovskite-type metal oxide represented by general formula (1) below as a main component, wherein the average valence of Sn contained in the general formula (1) lies between 2 and 4.

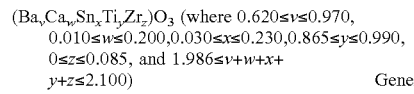

$(Ba_vCa_wSn_xTi_yZr_z)O_3$ (where $0.620 \le v \le 0.970$, $0.010 \le w \le 0.200, 0.030 \le x \le 0.230, 0.865 \le y \le 0.990$, $0 \le z \le 0.085$, and $1.986 \le v+w+x+y+z \le 2.100$)    General Formula (1)

A piezoelectric element according to the present invention includes a first electrode, a piezoelectric material portion, and a second electrode. A piezoelectric material constituting the piezoelectric material portion is the above-described piezoelectric material, and a portion or the entire of the piezoelectric material portion has remanent polarization in a region held between the first electrode and the second electrode.

A multilayered piezoelectric element according to the present invention includes a plurality of piezoelectric material layers and a plurality of electrode layers containing internal electrodes, the piezoelectric material layers and the electrode layers being alternately laminated. The piezoelectric material layers are composed of the above-described piezoelectric material, and each of the piezoelectric material layers has a region held by the electrode layers and partially or entirely having remanent polarization.

A liquid discharge head according to the present invention includes a liquid chamber including a vibration portion in which the piezoelectric element or the multilayered piezoelectric element is disposed, and a discharge port communicating with the liquid chamber.

A liquid discharge apparatus according to the present invention includes a stage configured to receive an object and the liquid discharge head.

An ultrasonic motor according to the present invention includes a vibrating body in which the piezoelectric element or the multilayered piezoelectric element is disposed, and a moving body in contact with the vibrating body.

An optical apparatus according to the present invention includes the ultrasonic motor provided on a drive unit.

An oscillatory apparatus according to the present invention includes a vibrating body in which the piezoelectric element or the multilayered piezoelectric element is disposed on a diaphragm.

A dust removing apparatus according to the present invention includes a vibrating portion provided with the oscillatory apparatus.

An image pick-up apparatus according to the present invention includes the dust removing apparatus and an image pick-up element unit, wherein a diaphragm of the dust removing apparatus is provided on the light-receiving surface side of the image pick-up element unit.

An electronic apparatus according to the present invention includes a piezoelectric acoustic component provided with the piezoelectric element or the multilayered piezoelectric element.

Advantageous Effects of Invention

According to the present invention, it is possible to provide a lead-free piezoelectric material having a high piezoelectric constant over a wide operating temperature region.

It is also possible to provide a piezoelectric element, a multilayered piezoelectric element, a liquid discharge head, a liquid discharge apparatus, an ultrasonic motor, an optical apparatus, an oscillatory apparatus, a dust removing apparatus, an image-pickup apparatus, and an electronic apparatus, which use the piezoelectric material.

DESCRIPTION OF EMBODIMENTS

Figure 1A:
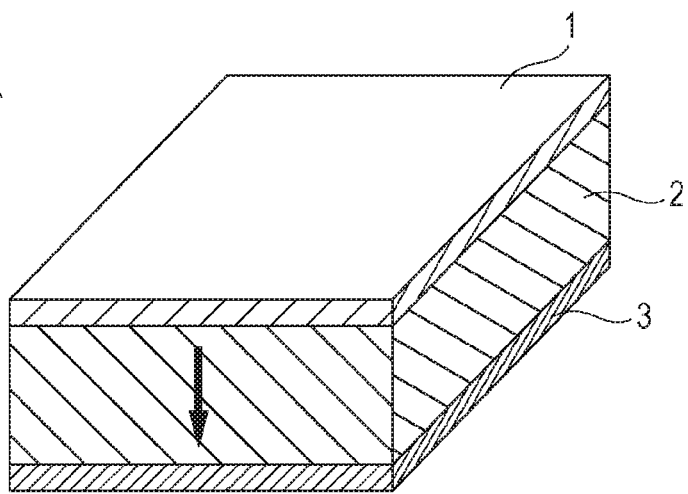
FIGS. 1A to 1C are schematic drawings showing a configuration of a piezoelectric element according to an embodiment of the present invention.

Embodiments of the present invention are described below.

A piezoelectric material according to the present invention includes a perovskite-type metal oxide represented by general formula (1) below as a main component, wherein the average valence of Sn contained in the general formula (1) lies between 2 and 4.

$(Ba_vCa_wSn_xTi_yZr_z)O_3$ (where $0.620 \le v \le 0.970$, $0.010 \le w \le 0.200, 0.030 \le x \le 0.230, 0.865 \le y \le 0.990$, $0 \le z \le 0.085$, and $1.986 \le v+w+x+y+z \le 2.100$) 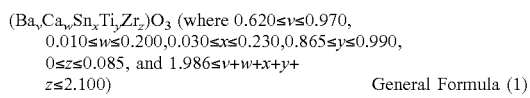

(Perovskite-Type Metal Oxide)

In the present invention, a perovskite-type metal oxide represents a metal oxide having a perovskite structure which is ideally a cubic structure as described in Iwanami Kagaku Jiten 5th edition (issued by Iwanami Shoten, Feb. 20, 1998). Metal oxides having the perovskite structure are generally represented by the chemical formula $ABO_3$. In a perovskite-type metal oxide, elements A and B occupy, in an ionic form, specified positions referred to as A-site and B-site, respectively, respectively, in a unit cell. For example, in a cubic unit cell, A element is positioned at a vertex of a cube, and B element is positioned at the body center of the cube. The O elements occupy, as oxygen anions, the face-centered positions of the cube. When the coordinates of the object position of each of the A element, B element, and O elements in a unit cell slightly shift from their symmetry sites, the unit cell of a perovskite structure is distorted to form a crystal system such as a tetragonal system, a rhombohedral system, or art orthorhombic system.

The metal oxide represented by the general formula (1) includes Ba, Ca, Sn, Ti, and Zr as metal elements. In view of the ion radii of the elements and possible valences thereof, ideally, metal elements which can be positioned at the A-site in a perovskite structure are divalent Ba, Ca, and Sn, and metal elements which can be positioned at the B-site in a perovskite structure are tetravalent Sn, Ti, and Zr. There are some allowable exceptions, and a portion, for example, 1 mol % or less of Ba and Ca may be positioned at the B-site and 1 mol % or less of Ti and Zr may be positioned at the A-site. In addition, the piezoelectric material of the present invention may contain Sr at such a content level as in a Ba raw material and Hf and Nb at such a content level as in a Ti raw material. In addition, the molar ratio of the total (v+w+x+y+z) of the elements at the A-site and the B-site to elements in the general formula (1) is 1.986:3 to 2.100:3 and includes ratios slightly deviated from the ideal ratio of 2:3. This indicates an allowable range of excess and deficiency of O element in the perovskite structure, and the range of the present invention includes these ratios as long as the metal oxide has the perovskite structure as a main phase.

It can be determined by, for example, structural analysis through X-ray diffraction or electron beam diffraction that the metal oxide represented by the general formula (1) has a perovskite structure. When the perovskite-type metal oxide represented by the general formula (1) has a tetragonal structure as a crystal system at room temperature, good piezoelectric characteristics can be obtained.

The perovskite-type metal oxide represented by the general formula (1) can be rewritten into general formula (2) below as a formula where the A-site metals and the B-site metals are discriminated from each other.

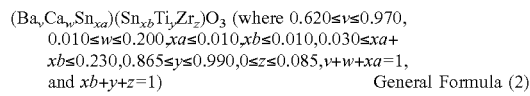

(where $0.620 \leq v \leq 0.970$, $0.010 \leq w \leq 0.200$, $xa \leq 0.010$, $xb \leq 0.010$, $0.030 \leq xa+xb \leq 0.230$, $0.865 \leq y \leq 0.990$, $0 \leq z \leq 0.085$, $v+w+xa=1$, and $xb+y+z=1$)  General Formula (2)

The general formula (2) is described as an ideal composition formula of the perovskite-type metal oxide so that the molar ratio between the A-site elements, the B-site elements, and O element is 1:1:3. However, like in the range of $(v+w+x+y+z)$ described above for the general formula (1), deviation of the ratio of element amounts can also be taken into consideration.

That is, even when the ratio between the element amounts in the general formula (2) is slightly deviated (for example, the ratio of O element is in the rage of 2.857 to 3.021), the range of the present invention includes the ratio as long as the metal oxide has the perovskite structure as a main phase.

(Form of Piezoelectric Material)

The form of a piezoelectric material of the present invention is not limited, and the form may be any one of a ceramic, a powder, a single crystal, a film, and a slurry, but is particularly preferably a ceramic. In the specification, the term "ceramics" represents an aggregate (also referred to as a "bulk body") of crystal grains composed of a metal oxide as a basic component and produced by baking by heat treatment, that is, represents a so-called polycrystal. Ceramics include products processed after sintering.

(Average Valence of Sn)

The average valence of Sn contained in the general formula (1) lies between 2 and 4, and more preferably in the range of 2.2 or more and 3.7 or less. When the average valence of Sn positioned at the A-site or B-site in the perovskite structure is in the above-described range, piezoelectric characteristics and depolarization temperature are improved as compared with (Ca, Zr)-substituted barium titanate not containing Sn. Also, piezoelectric characteristics are significantly improved as compared with the metal oxide of the general formula (1) containing Sn having an average valence of 2. In addition, the depolarization temperature is significantly improved as compared with the metal oxide of the general formula (1) containing Sn having an average valence of 4.

The method for confirming that the average valence of Sn lies between 2 and 4 is not limited, but it can be determined by X-ray photoelectron spectroscopy (hereinafter abbreviated as "XPS") or Mossbauer spectroscopy. In XPS, the peak positions of detected intensities of divalent Sn and tetravalent Sn are different due to chemical shift produced in bond energy of bound electrons. When divalent Sn and tetravalent Sn are mixed, the average valence of Sn lies between 2 and 4. In fact, a peak corresponding to divalent Sn and a peak corresponding to tetravalent Sn are integrally observed because of a small amount of chemical shift. However, by using a peak resolution function provided in a commercial XPS apparatus, it can be determined whether or not divalent Sn and tetravalent Sn are mixed. In particular, when a peak area ratio is in the range of 1:5 to 9:1, the average valence is 2.2 or more and 3.7 or less, and the effect of the present invention that the piezoelectric characteristics and depolarization temperature are improved is significantly exhibited. On the other hand, Mossbauer spectroscopy is a method of measuring an absorption spectrum by using the Mossbauer effect of gamma-ray resonance absorption by atomic nuclei. The gamma rays are monochromatic light, and thus the energy thereof is changed by using the Doppler effect when a ray source is moved. In a Mossbauer spectrum in which the Doppler velocity value is shown in the abscissa, and transmittance is shown in the ordinate, the peak positions of detected intensities of Sn with different valences are different due to an isomer shift. When a peak (in a broad peak, a center-of-gravity position) of a measurement sample is present between a peak due to divalent Sn and a peak due to tetravalent Sn which are determined by using a reference material, it is considered that the average valance of Sn lies between 2 and 4. Alternatively, even when a peak of a measurement sample is observed to overlap both a peak due to divalent Sn and a peak due to tetravalent Sn which are determined by using a reference material, it is considered that the average valance of Sn lies between 2 and 4. In any one of the cases, a $^{119}$Sn Mossbauer spectrum is measured, and the Doppler shift (mm/s) of the ray source is shown in the abscissa, and the count number or relative intensity (%) per channel is shown in the ordinate. On the other hand, the same spectrum of a reference sample is measured to determine the peak position (for example, in the range of −0.4 to +0.7 mm/s) of tetravalent Sn and the peak position (for example, in the range of +2.3 to +4.0 mm/s) of divalent Sn. Divalent Sn generally shows a peak split into two peaks. The measurement of the reference sample can indicate a relation between the numbers of divalent Sn atoms and tetravalent Sn atoms and the peak areas of a spectrum. For example, when peaks have the same area by fitting so that a peak in a $^{119}$Sn Mossbauer spectrum of the reference sample is divided into peaks of divalent Sn and tetravalent Sn, the molar ratio between divalent Sn and tetravalent Sn is about 1:15. The average valence of Sn can be calculated from the molar ratio. In particular, when the average valence is 2.2 or more and 3.7 or less, the effect of the present invention that the piezoelectric characteristics and depolarization temperature are improved is significantly exhibited.

Also, when the average valence determined by the XPS and Mossbauer spectroscopy is considered to be due to a mixture of divalent Sn and tetravalent Sn, the ratio between the xa value and the xb value in the general formula (2) can be calculated.

(Main Component of Piezoelectric Material)

In the metal oxide represented by the general formula (1) and the general formula (2), Ba of perovskite barium titanate is partially substituted by Ca and Sn. Also, Ti of the barium titanate may be partially substituted by Zr.

In the general formula (1) and the general formula (2), v representing the molar ratio of Ba at the A-site is within the range of $0.620 \leq v \leq 0.970$, and y representing the molar ratio of Ti at the B-site is within the range of $0.865 \leq y \leq 0.990$. When the piezoelectric material of the present invention is mainly composed of barium titanate, satisfactory piezoelectric characteristics can be obtained. However, when v is smaller than 0.620, the piezoelectric material of the present invention has unsatisfactory piezoelectric characteristics. On the other hand, when v is larger than 0.970, a piezoelectric element using the piezoelectric material of the present invention has a low depolarization temperature or a satisfactory mechanical quality factor cannot be obtained in a device drive temperature range of the piezoelectric element using the piezoelectric material of the present invention. In addition, when y is smaller than 0.865, a piezoelectric element using the piezoelectric material of the present invention has a low depolarization temperature. On the other hand, when y is larger than 0.990, the piezoelectric material of the present invention has unsatisfactory piezoelectric characteristics. The more preferred range or v is $0.750 \leq v \leq 0.900$. The more preferred range of y is $0.920 \leq y \leq 0.970$.

In the general formula (1) and the general formula (2), w representing the molar ratio of Ca at the A-site is within a range of $0.010 \leq w \leq 0.200$. When Ba in perovskite-type barium titanate is partially substituted by Ca within the above range, an orthorhombic-tetragonal phase transition temperature shifts to the low-temperature side, and thus piezoelectric characteristics stable within a device drive temperature range of the piezoelectric element using the piezoelectric material of the present invention can be achieved. However, when w is larger than 0.200, piezoelectric characteristics of the piezoelectric material of the present invention becomes unsatisfactory. On the other hand, when w is smaller than 0.010, a satisfactory mechanical quality factor cannot be obtained within a device drive temperature range of the piezoelectric element using the piezoelectric material of the present invention. With a small amount of Ca, stability of the solid-solution state of Sn at the A-site is degraded, thereby decreasing the effect of substitution with Sn. The more preferred range of w is $0.050 \leq w \leq 0.140$.

In the general formula (1), x representing the molar ratio of Sn in the metal oxide is within a range of $0.030 \leq x \leq 0.230$. It can be considered that in the piezoelectric material of the present invention, Ba and Ti of perovskite barium titanate are partially substituted by Sn. When Ba is partially substituted by Sn within the above range, distortion of the polarization direction of the perovskite structure is increased, thereby improving the depolarization temperature of the piezoelectric material by 10° C. to 50° C. When Ti is partially substituted by Sn having a smaller ion radius within the above range, tetragonal properties of a unit cell of the perovskite structure are decreased, thereby improving the piezoelectric characteristics. When the A-site and the B-site are simultaneously substituted by Sn, a piezoelectric material having good piezoelectric characteristics over a wide operating temperature range can be produced. Also, only the B-site of barium titanate is substituted by Sn, there is generally the tendency to decrease the depolarization temperature. However, as in the present invention, both the A-site and the B-site of barium titanate are substituted by an appropriate amount of Sn, decrease in the depolarization temperature is suppressed due to the occurrence of synergy effect. However, when x is larger than 0.230, the depolarization temperature of the piezoelectric material is decreased, and piezoelectric characteristics in a high-temperature atmosphere, for example, at 50° C., may become unsatisfactory. On the other hand, when x is smaller than 0.030, a difference in characteristics from (Ca, Zr)-substituted barium titanate not containing Sn is decreased, thereby failing to achieve the satisfactory effect of the present invention. The more preferred range of x is $0.060 \leq x \leq 0.200$.

In the general formula (2), xa representing the molar ratio of Sn at the A-site is within a range of $xa \leq 0.010$. When Ba is partially substituted by Sn within the above range, distortion of the polarization direction of the perovskite structure is increased, thereby improving the depolarization temperature of the piezoelectric material by 10° C. to 50° C. When xa is smaller than 0.010, conversely, the depolarization temperature of the piezoelectric material may be decreased.

In the general formula (2), xb representing the molar ratio of Sn at the B-site is within a range of $xb \leq 0.010$. When Ti is partially substituted by Sn having a smaller ion radius within the above range, tetragonal properties of a unit cell of the perovskite structure are decreased, thereby improving the piezoelectric characteristics. When xb is smaller than 0.010, the piezoelectric characteristics may be degraded. In particular, when xb is smaller than 0.010 at z=0, the piezoelectric characteristics may become unsatisfactory. Also, $0.030 \leq xa+xb \leq 0.230$ is satisfied, and when xa+xb is larger than 0.230, the depolarization temperature of the piezoelectric material is decreased, and the operating temperature rage is narrowed. On the other hand, when xa+xb is smaller than 0.030, a difference in characteristics from (Ca, Zr)-substituted barium titanate not containing Sn is decreased, thereby failing to achieve the satisfactory effect of the present invention.

The upper limit of xa is 0.220 and more preferably $xa \leq 0.180$. When xa is larger than 0.180, insulation and piezoelectric characteristics of the piezoelectric material tend to be slightly decreased.

The upper limit of xb is 0.210 and more preferably $xb \leq 0.050$. When xb is larger than 0.050, the depolarization temperature is decreased, and the operating temperature range is narrowed. In the general formula (1), x corresponds to the sum of xa and xb in the general formula (2).

In the general formula (1) and the general formula (2), z representing the molar ratio of Zr at the B-site is within a range of $0 \leq z \leq 0.085$. Regardless of whether or not the Ti-site is partially substituted by Zr, a high piezoelectric constant in a wide operating temperature range, which is achieved by the main effect of the present invention, can be obtained. However, when the Ti-site is partially substituted by Zr within the above range, the higher piezoelectric characteristics can be achieved because c/a is decreased to be close to 1 due to a decrease in tetragonal distortion of the piezoelectric material. A range of $0.005 \leq z \leq 0.085$ is more preferred. When z is larger than 0.085, the depolarization temperature is decreased, and the operating temperature range is narrowed.

In the general formula (2), xb+z which represents the total molar ratio of Sn and Zr at the B-site is preferably $xb+z \leq 0.860$. When xb+z is smaller than 0.860, the depolarization temperature is decreased, and the operating temperature range is narrowed.

In the specification, the term "depolarization temperature (referred to as "$T_d$") represents a temperature at which the piezoelectric constant is decreased as compared with that before the temperature is increased from room temperature to a certain temperature $T_d$ (° C.) and again decreased to room temperature after the elapse of a sufficient time after polarization. In the specification, the temperature at which the piezoelectric constant is decreased to less than 90% of that before the temperature is increased is referred to as the "depolarization temperature $T_d$".

A method for measuring the composition of the piezoelectric material according to the present invention is not particularly limited. Examples of the method include X-ray fluorescence spectrometry, ICP emission spectrometry, atomic absorption spectrometry, and the like. The weight ratio and composition ratio of each of the elements contained in the piezoelectric material can be calculated by any one of these methods.

(First Sub-Component of Piezoelectric Material)

The piezoelectric material according to the present invention can contain, as a sub-component, 0.04 parts by weight to 0.40 parts by weight of Mn in terms of metal relative to 100 parts by weight of the metal oxide represented by the general formula (1) and the general formula (2). The content of the sub-component in terms of metal is represented by a ratio of weight of Mn metal to a total weight of 100, which is determined by calculating the contents of elements constituting the metal oxide represented by the general formula (1) or the general formula (2) in terms of oxide based on the contents of metals determined by measuring the piezoelectric material by X-ray fluorescence spectrometry, ICP emission spectrometry, atomic absorption spectrometry, or the like. In determining a content in terms of oxide, a crystal structure (for example, a perovskite structure) is previously specified through an X-ray diffraction experiment, and the oxygen number is calculated based on the specified crystal structure and the analysis results of the contents of metals. The perovskite-structure oxide is generally expressed by the composition formula $ABO_3$, but the calculated oxygen number may be deviated by several % from the viewpoint of charge balance.

When the piezoelectric material contains Mn within the above-described range, the insulation and mechanical quality factor are improved without degrading the piezoelectric characteristics over the entire drive temperature region of the piezoelectric material. The mechanical quality factor is a factor representing an elastic loss due to vibration when the piezoelectric material is evaluated as an oscillator, and the magnitude of the mechanical quality factor is observed as sharpness of a resonance curve in impedance measurement. That is, the mechanical quality factor is a constant representing the sharpness of resonance of an oscillator. When the insulation and mechanical quality factor of a piezoelectric element are improved, long-term reliability of the piezoelectric element using the piezoelectric material can be secured during drive.

When the Mn content is less than 0.04 parts by weight, improvements in the insulation and mechanical quality factor may not be expected as compared with the piezoelectric element of the present invention not containing Mn. On the other hand, when the Mn content is larger than 0.40 parts by weight, the insulation and piezoelectric constant may be decreased as compared with the piezoelectric element of the present invention not containing Mn. The Mn content is more preferably within a range of 0.08 parts by weight or more and 0.30 parts by weigh or less. When the resistivity of the piezoelectric element of the present invention is 1 G$\Omega$·cm or more, a leak current by polarization can be suppressed, and a leak current can also be suppressed when the piezoelectric element is driven. The resistivity is more preferably 30 G$\Omega$·cm or more. The mechanical quality factor of the piezoelectric material of the present invention is preferably 450 or more and more preferably 600 or more. The piezoelectric element using the piezoelectric material having a mechanical quality factor of less than 450 may be increased in power consumption during resonant drive of the element.

Mn is partially or entirely present at the B-site of the perovskite-type metal oxide represented by the general formula (1). In addition, the valence of Mn is preferably 4+. In general, Mn can take a valence of 4+, 2+, or 3+. When conduction electrons are present in a crystal (for example, when oxygen defects are present in a crystal or when a donor element occupies the A-site), the valence of Mn is decreased from 4+ to 3+ or 2+ to trap the conduction electrons, and thus insulation of the piezoelectric element can be improved. In view of the ion radius, Ti as a main component at the B-site can be easily substituted by Mn with a valence of 4+. On the other hand, when the valence of Mn is 2+ lower than 4+, Mn functions as an acceptor. When Mn is present as an acceptor in a perovskite structure crystal, holes are produced in the crystal or oxygen vacancies are formed in the crystal. When the valence of Mn is 2+ or 3+, holes cannot be compensated only by introducing oxygen vacancies, thereby decreasing the insulation of the piezoelectric element. Therefore, the valence of Mn is mostly 4+.

(Second Sub-Component of Piezoelectric Material)

The piezoelectric material according to the present invention preferably contains, as a sub-component, 0.850 parts by weight or less of Bi in terms of metal relative to 100 parts by weight of the metal oxide represented by the general formula (1) and the general formula (2). The piezoelectric material more preferably contains 0.042 parts by weight or more and 0.850 parts by weight or less of Bi in terms of metal.

When the metal oxide represented by the general formula (1) contains Bi within the above range, the mechanical quality factor is improved without deterioration in the piezoelectric constant. Bi having a stable valence of 3 is mostly positioned at the A-site, and the remaining Bi is considered to be positioned at the B-site or crystal grain boundaries. Since Bi is mostly positioned at the A-site, a satisfactory mechanical quality factor can be obtained even when the crystal structure is an orthorhombic structure. When the crystal structure is a tetragonal structure, defective dipoles (serving as sources for internal electric field) are introduced in a crystal lattice because of a small amount Bi at the B-site has a different valence from Ti and Zr (mainly tetravalent), thereby improving the mechanical quality factor. Therefore, in either the orthorhombic or tetragonal crystal structure, the Bi contained provides a large mechanical quality factor. Therefore, when the piezoelectric material of the present invention contains an appropriate amount of Bi, a satisfactory mechanical quality factor can be obtained over a wide operating temperature region.

The lower limit of the Bi content is not limited, but when the content is lower than 0.042 parts by weight, improvement in the mechanical quality factor may not be expected as compared with the piezoelectric material of the present invention not containing Bi. On the other hand, when the Bi content is higher than 0.850 parts by weight, the piezoelectric characteristics undesirably become unsatisfactory. From the viewpoint, of achieving the more preferred mechanical quality factor and piezoelectric constant over a wide operating temperature region, for example, in a range of −30° C. to 50° C., the Bi content is more preferably 0.100 parts by weight or more and 0.850 parts by weight or less and further preferably 0.100 parts by weight or more and 0.480 parts by weight or less.

The form of Bi contained is not limited to metal Bi as long as Bi is contained as a Bi component in the piezoelectric material. For example, Bi may be dissolved at the A-site or the B-site or may be contained at boundaries between crystal grains (hereinafter referred to as "grain boundaries"). Also, the Bi component may be contained in the form of a metal, ion, an oxide, a metal salt, a complex, or the like in the piezoelectric material.

(Third Sub-Component of Piezoelectric Material)

The piezoelectric material according to the present invention can contain, as a third sub-component, 0.10 parts by weight or less of Mg in terms of metal relative to 100 parts by weight of the metal oxide represented by the general formula (1). The content of the sub-component in terms of metal is represented by a ratio of weight of Mg metal to a total weight of 100, which is determined by calculating the contents of elements constituting the metal oxide represented by the general formula (1) in terms of oxide based on the contents of metals determined by measuring the piezoelectric material by X-ray fluorescence spectrometry (XRF), ICP emission spectrometry, atomic absorption spectrometry, or the like. When the piezoelectric material contains Mg within the above range, the mechanical quality factor is improved. When the Mg content is larger than 0.10 parts by weight, the effect of improving the mechanical quality factor cannot be expected, and conversely the mechanical quality factor may be decreased. In view of the large effect of improving the mechanical quality factor, the Mg content is more preferably 0.05 parts by weight or less.

The form of Mg contained is not limited to metal Mg as long as Mg is contained as a Mg component in the piezoelectric material. For example, Mg may be dissolved at the A-site or the B-site in the perovskite structure or may be contained at grain boundaries. Also, the Mg component may be contained in the form of a metal, ion, an oxide, a metal salt, a complex, or the like in the piezoelectric material.

(Other Sub-Component)

The piezoelectric material according to the present invention may contain components (referred to as "fourth sub-components" hereinafter) other than the component represented by the general formula (1) or the general formula (2), Mn, Bi, and Mg within a range where the characteristics are not changed. The total content of the fourth sub-components is 1.2 parts by weight or less relative to 100 parts by weight of the metal oxide represented by the general formula (1) or the general formula (2). When the total content of fourth sub-components exceeds 1.2 parts by weight, the piezoelectric characteristics and insulation properties of the piezoelectric material may be degraded. The content of a metal element other than Ba, Ca, Sn, Ti, Zr, Mn, Bi, and Mg as the fourth sub-components is preferably 1.0 part by weight or less in terms of oxide or 0.9 parts by weight or less in terms of metal in the piezoelectric material. In the specification, the metal elements include semimetal elements such as Si, Ge, Sb, and the like. When the content of a metal element other than Ba, Ca, Sn, Ti, Zr, Mn, Bi, and Mg as the fourth sub-components exceeds 1.0 part by weight in terms of oxide or 0.9 parts by weight in terms of metal relative to the piezoelectric material, the piezoelectric characteristics and insulation properties of the piezoelectric material may be significantly degraded. The total of Li, Na, and Al elements among the fourth sub-components is preferably 0.5 parts by weight or less in terms of metal relative to the piezoelectric material. When the total of Li, Na, and Al elements among the fourth sub-components exceeds 0.5 parts by weight in terms of metal relative to the piezoelectric material, sintering may become insufficient. The total of Y and V elements among the fourth sub-components is preferably 0.2 parts by weight or less in terms of metal relative to the piezoelectric material. When the total of Y and V elements among the fourth sub-components exceeds 0.2 parts by weight in terms of metal relative to the piezoelectric material, polarization may be made difficult. Examples of the fourth sub-components include sintering aids such as Si and Cu. In addition, the piezoelectric material of the present invention may contain Sr in such an extent that Sr is contained as an inevitable component in commercially available raw materials of Ba and Ca. Similarly, the piezoelectric material of the present invention may contain Nb in such an extent that Nb is contained as an inevitable component in a commercially available raw material of Ti and Hf in such an extent that Hf is contained as an inevitable component in a commercially available raw material of Zr. A method for measuring parts by weight of the fourth sub-components is not particularly limited. Examples of the method include X-ray fluorescence spectrometry, ICP emission spectrometry, atomic absorption spectrometry, and the like.

(Grain Diameter and Equivalent Circle Diameter of Crystal Grains)

The average equivalent circle diameter of crystal grains constituting the piezoelectric material according to the present invention is preferably 0.3 µm or more and 10 µm or less. The crystal grains having an average equivalent circle diameter within this range enable the piezoelectric material to have good piezoelectric characteristics and mechanical strength. The crystal grains having an average equivalent circle diameter of less than 0.3 µm may cause unsatisfactory piezoelectric characteristics. On the other hand, the crystal grains having an average equivalent circle diameter of larger than 10 µm may degrade mechanical strength. The average equivalent circle diameter of crystal grains is more preferably within a range of 1 µm or more and 5 µm or less.

The crystal grains constituting the piezoelectric material can contain crystal grains having an equivalent circle diameter of 25 µm or less at 99% by number of grains or more. That is, the piezoelectric material is mostly occupied by the crystal grains having an equivalent circle diameter of 25 µm or less. When the percent by number of crystal grains having an equivalent circle diameter of 25 µm or less is within the above range, the piezoelectric material of the present invention can have good mechanical strength. The mechanical strength has a strong negative correlation to the content ratio of crystal grains having a large equivalent circle diameter. When the percent by number of crystal grains having an equivalent circle diameter of 25 µm or less is less than 99% by number of grains, the content ratio of grains having an equivalent circle diameter exceeding 25 µm is increased, and thus mechanical strength may be degraded.

The piezoelectric material may contain needle crystals having a long side exceeding 25 µm. In this case, the content of crystals of 25 µm or less in terms of equivalent circle diameter is preferably 99% by number of grains or more.

In the present invention, the term "equivalent circle diameter" represents a "projected area equivalent circle diameter" which is generally used in a microscopic observation method and which represents the diameter of a perfect circle having the same area as a projected area of a crystal grain. In the present invention, a method for measuring the equivalent circle diameter is not particularly limited. For example, the equivalent circle diameter can be determined by image processing of a photograph image obtained by projecting a surface of a piezoelectric material with a polarization microscope or a scanning electron microscope. Since the optimum magnification varies according to the grain diameter to be measured, an optical microscope and an electron microscope may be used depending on the optimum magnification. The equivalent circle diameter may be determined from an image of a polished surface or a section, not a surface of the material.

(Relative Density)

The relative density of the piezoelectric material according to the present invention is preferably 93% or more and 100% or less. The relative density represents a ratio of the measured density to the theoretical density calculated from the lattice constants of the piezoelectric material and the atomic weights of constituent elements of the piezoelectric material. The lattice constants can be measured by, for example, X-ray diffraction analysis. The density can be measured by, for example, an Archimedes method. When the relative density is lower than 93%, the piezoelectric characteristics and mechanical quality factor may be unsatisfactory, or insulation may be degraded. The lower limit, of the relative density is preferably 94% or more and more preferably 95% or more.

(Method for Producing Piezoelectric Material)

A method for producing the piezoelectric material according to the present invention is not particularly limited.

(Raw Material of Piezoelectric Material)

When a piezoelectric material is produced, a general solid phase sintering method can be used, in which a mixture of raw materials such as oxides, carbonates, nitrates, or oxalates, which contain respective target constituent elements, is sintered under atmospheric pressure. The raw materials preferably have higher purity. A metal oxide constituting the piezoelectric material, powders or liquids of metal salts can be used as the raw materials. The raw materials include metal compounds such as a Ba compound, a Ca compound, a Sn compound, a Ti compound, a Zr compound, a Mn compound, a Bi compound, and a Mg compound.

Examples of the Ba compound which can be used include barium oxide, barium carbonate, barium oxalate, barium acetate, barium nitrate, barium titanate, barium zirconate, barium zirconate titanate, and the like. These Ba compounds are preferably commercially available compounds of a high-purity type (for example, a purity of 99.99% or more). A Ba compound with low purity contains a large amount of Mg, and thus the mechanical quality factor of the piezoelectric material may be degraded.

Examples of the Ca compound which can be used include calcium oxide, calcium carbonate, calcium oxalate, calcium acetate, calcium titanate, calcium zirconate, calcium zirconate titanate, and the like. These Ca compounds are preferably commercially available compounds of a high-purity type (for example, a purity of 99.99% or more). A Ca compound with low purity contains a large amount of Mg, and thus the mechanical quality factor of the piezoelectric material may be degraded.

Examples of the Sn compound which can be used include tin oxide, barium stannate, barium stannate titanate, calcium stannate, and the like. These Sn compounds are preferably commercially available compounds of a high-purity type (for example, a purity of 99.99% or more). A raw material containing tetravalent Sn may be reduced to divalent Sn in a reducing atmosphere containing hydrogen-nitrogen mixed gas at an oxygen partial pressure of $1.0 \times 10^{-10}$ to $1.0 \times 10^{-12}$ MPa and then may be used. Since divalent Sn and tetravalent Sn are mixed in the piezoelectric material of the present invention, a Sn compound including a mixture or solid solution of divalent and tetravalent Sn is preferably selected as a raw material. The average valence of Sn in the piezoelectric material of the present invention can be adjusted by adjusting a mixing ratio between divalent Sn and tetravalent Sn in the raw material and an oxygen partial pressure in a firing process.

Examples of a Ti compound which can be used include titanium oxide, barium titanate, barium zirconate titanate, calcium titanate, and the like.

Examples of a Zr compound which can be used include zirconium oxide, barium zirconate, barium zirconate titanate, calcium zirconate, and the like.

Also, perovskite-type metal oxide powders such as a $BaTiO_3$ powder, a $CaTiO_3$ powder, a $BaZrO_3$ powder, and a $CaZrO_3$ powder, a $BaSnO_3$ powder, and a $CaSnO_3$ powder may be used as raw materials.

Examples of a Mn compound which can be used include manganese carbonate, manganese oxide, manganese dioxide, manganese acetate, trimanganese tetraoxide, and the like.

Examples of a Bi compound which can be used include bismuth oxide, lithium bismuthate, and the like.

Examples of a Mg compound which can be used include magnesium carbonate, magnesium oxide, magnesium hydroxide, magnesium peroxide, magnesium chloride, and the like.

(Granulated Powder and Compact)

When the piezoelectric material used for the piezoelectric element of the present invention is formed into a ceramic (sintered body, it is necessary to form a compact used for firing. The compact is a solid produced by molding a raw material powder.

Examples of a molding method include uniaxial pressure processing, cold hydrostatic processing, hot hydrostatic processing, cast molding, and extrusion molding. In order to form a compact, a granulated powder is preferably used. Sintering the compact using the granulated powder has the advantage of easily producing a sintered body having a uniform crystal grain size distribution.

A method for granulating the raw material powder of the piezoelectric material is not particularly limited, but a spray dry method is most preferred as the granulating method from the viewpoint that the grain size of the granulated powder can be made more uniform.

Examples of a binder which can be used for granulation include PVA (polyvinyl alcohol), PVB (polyvinyl butyral), and acrylic resins. The amount of the binder added is preferably 1 part by weight to 10 parts by weight relative to the raw material powder of the piezoelectric material, and the amount is more preferably 2 parts by weight to 5 parts by weight from the view point of increasing the density of the compact.

(Sintering)

A method for sintering the compact to produce a ceramic piezoelectric material is not particularly limited, but sintering in a reducing atmosphere (low-oxygen atmosphere) is preferred for allowing Sn element to stably present not only at the A-site but also at the B-site in a perovskite structure. For example, for the purpose of previously removing organic components such as the binder, heat treatment is performed at 500° C. or less in the atmospheric or excess-oxygen atmosphere. Next, heat treatment is performed as a main firing process for promoting crystallization in a reducing atmosphere at about 1100° C. to 1400° C. to produce a sintered body (ceramic). When the time of heat treatment as the main firing process is 3 hours or more, growth of crystal grains is accelerated. When the time of heat treatment as the main firing process is 24 hours or less, the amount of oxygen deficiencies desirably does not become excessive. The reducing atmosphere is preferably an atmosphere in which an oxygen partial pressure is controlled to be $1.0 \times 10^{-10}$ MPa or more and $1.0 \times 10^{-8}$ MPa or less in order to keep the average valence of Sn element at an intermediate between 2 and 4. When the oxygen partial pressure is lower than $1.0 \times 10^{-10}$ MPa, the average valence of Sn becomes 2, and thus the piezoelectric characteristics of the piezoelectric material may be degraded. On the other hand, when the oxygen partial pressure is higher than $1.0 \times 10^{-8}$ MPa, the average valence of Sn becomes 4, and thus the depolarization temperature of the piezoelectric material may be decreased. On the basis of this phenomenon, the piezoelectric material of the present invention in which the average valence of Sn lies between 2 and 4 can be produced by previously firing perovskite-type metal oxide intermediates having average valences of 2 and 4 in respective reducing atmospheres, then mixing the metal oxide intermediates, and re-firing the resultant mixture. For example, a method includes separately synthesizing $(Ba, Ca, Sn)^{2+}(Ti, Zr)^{4+}O_3$ perovskite-type metal oxide powder and $(Ba, Ca)^{2+}(Ti, Zr, Sn)^{4+}O_3$ perovskite-type metal oxide powder, then mixing the powders, and re-sintering the mixture. The maximum temperature of re-sintering is preferably 600° C. or more and 1200° C. or less, and this temperature range causes no change in valence even in the air atmosphere. The oxygen partial pressure can be calculated from the oxygen concentration measured by a zirconia-type oxygen concentration meter. In order to form the reducing atmosphere, a hydrogen ($H_2$)-containing gas, a water vapor ($H_2O$)-containing gas, or an argon (Ar)-containing gas can be used. Among these gases, the hydrogen-containing gas is preferably used in view of reducibility, specific heat, and thermal conductivity. A hydrogen-nitrogen mixed gas or a hydrogen-nitrogen-water vapor mixed gas may be used. The ceramic sintered in the reducing atmosphere may have oxygen deficiencies. When the ceramic used for the piezoelectric element has oxygen deficiencies, piezoelectric characteristics may be greatly degraded. Therefore, for the purpose of decreasing (compensating) oxygen deficiencies, post heating (post-annealing) may be performed for ceramic in an atmosphere with a higher oxygen partial pressure than in main firing. In order to prevent a change of the valence of Sn, the maximum temperature of post-heating is preferably less than 1100° C. The time of heat treatment for post-heating is preferably 1 hour or more because the significant effect of decreasing oxygen deficiencies can be obtained. The heat treatment time of 12 hours or less is preferred because a change of the valence of Sn can be suppressed.

(Polishing)

The sintered body can be used directly as the piezoelectric material of the present invention. Polishing may be performed for forming the sintered body in a desired shape. After polishing, the sintered body is preferably heat-treated at 150° C. or more and 500° C. or less for about 1 hour to 4 hours. The atmosphere of the heat treatment is not particularly limited. Although residual stress is produced in the piezoelectric material (sintered body) mechanically polished, the residual stress is relaxed by the heat treatment, thereby further improving the piezoelectric characteristics of the piezoelectric material.

(Thickness of Ceramic Piezoelectric Material)

When the piezoelectric material of the present invention is formed into a ceramic (sintered body), the distance between two surfaces which are smoothed by polishing is regarded as the thickness of the piezoelectric material. The thickness is preferably 100 µm or more and 10 mm or less and more preferably 200 µm or more and 5 mm or less. With the thickness of 100 µm or less, the adverse effect of defective portions produced by processing of ceramic on the piezoelectric characteristics may be increased. On the other hand, with the thickness of 10 mm or more, when an element is produced by using the piezoelectric material of the present invention and subjected to polarization, the effect improving the piezoelectric characteristics may become unsatisfactory.

(Film-Shaped Piezoelectric Material)

When the piezoelectric material is used as a film formed on a substrate, the thickness of the piezoelectric material is preferably 200 nm or more and 10 µm or less and more preferably 300 nm or more and 3 µm or less. When the film of the piezoelectric material has a thickness of 200 nm or more and 10 µm or less, the sufficient electric-mechanical conversion function of the piezoelectric element can be achieved.

A method for forming the film-shaped piezoelectric material is not particularly limited. Examples of the method include a chemical solution deposition method (CSD method), a sol-gel method, a metal-organic chemical vapor deposition method (MOCVD method), a sputtering method, a pulse laser deposition method (PLD method), a hydrothermal synthesis method, an aerosol deposition method (AD method), and the like. Among these, the chemical solution deposition method or the sputtering method is the most preferred deposition method. The chemical solution deposition method or the sputtering method can easily increase a deposition area and can promote crystallization in a reducing atmosphere (low oxygen atmosphere), and thus Sn element can be easily allowed to stably present at both the A-site and the B-site in the perovskite structure.

The substrate is a preferably a single crystal substrate which is cut and polished along a (001) plane or (110) plane. By using the single crystal substrate cut and polished along a specified crystal plane, a piezoelectric material film provided on a surface of the substrate can be strongly oriented in the same direction.

(Piezoelectric Element)

FIG. 1A is a schematic drawing showing a configuration of a piezoelectric element according to an embodiment of the present invention. The piezoelectric element according to the present invention includes a first electrode 1, a piezoelectric material portion 2, and a second electrode 3, and the piezoelectric material portion 2 includes the piezoelectric material of the present invention. Other electrodes may be provided on a surface of the piezoelectric material portion 2. The piezoelectric material portion 2 preferably includes a piece of piezoelectric material. The piece of piezoelectric element represents a seamless piezoelectric ceramic material produced by simultaneously firing raw materials having same composition. An arrow described in the piezoelectric material portion 2 schematically shows the direction of remanent polarization possessed by the piezoelectric material.

The piezoelectric material portion 2 has a region which is held between the first electrode 1 and the second electrode 3 and in which a region having remanent polarization is present. The region having remanent polarization may be a portion or entire of the piezoelectric material portion 2 in the region held between the first electrode 1 and the second electrode 3, but from the viewpoint of enhancing the piezoelectric characteristics, the entire region held between the first electrode 1 and the second electrode 3 preferably has remanent polarization. The remanent polarization represents polarization remaining in the piezoelectric material portion 2 when an external electric field is not applied to the piezoelectric material portion 2. Polarization of the piezoelectric material portion 2 produces spontaneous polarization uniform in a certain direction in the piezoelectric material portion 2 and produces remanent polarization. Whether or not the piezoelectric material portion 2 has remanent polarization can be determined by applying an electric field between the first electrode 1 and the second electrode 2 of the piezoelectric element and measuring a relation (P-E hysteresis curve) between the applied electric field E and polarization amount P. When the piezoelectric material in the piezoelectric element of the present invention has remanent polarization in a certain direction, the direction of dipole moment of polarization involved in piezoelectric drive is uniform, thereby increasing the piezoelectric constant of the piezoelectric element.

Figure 1B:
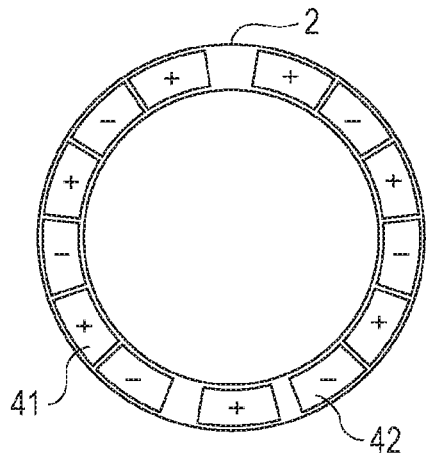
Figure 1C:
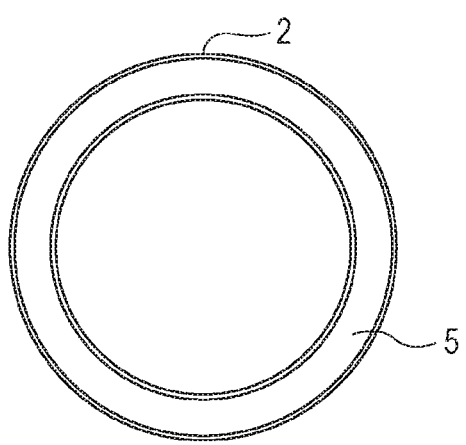

FIGS. 1B and 1C are schematic drawings showing a configuration of a piezoelectric element according to another embodiment of the present invention. FIG. 1B is a schematic drawing showing the shape of an electrode and the polarities of remanent polarization when a piezoelectric element of the present invention is observed from one of the surfaces, and FIG. 1C is a schematic drawing showing the shape of an electrode when the piezoelectric element is observed from the other surface. The piezoelectric element according to the present invention shown in FIGS. 1B and 1C includes a piece of ring piezoelectric material 2, a plurality of electrodes 41 and 42 (including electrodes with no numerical number) disposed on one of the surfaces of the piezoelectric material 2, and a common electrode 5 disposed on the other surface of the piezoelectric material 2. In FIG. 1B, the symbols "+" and "−" described in the electrodes 41 and 42 each represent the polarity of remanent polarization of a piezoelectric material in a region held between each of the electrodes and the common electrode on the opposite surface. In the specification, the symbol is described in an electrode portion in which a positive electric field is applied by polarization in the process of manufacturing the piezoelectric element, and thus a negative value is detected by measuring the piezoelectric constant $d_{33}$ only in the "+" electrode portions. Similarly, the positive piezoelectric constant $d_{33}$ is detected in the "−" electrode portions. In FIG. 1B, in a region not provided with an electrode or a region (not shown) of the piezoelectric material held between an electrode not having remanent polarization and the common electrode 5 on the opposite surface, the piezoelectric constant $d_{33}$ of zero or a very small value, for example, 5 pC/N or less, is detected. The piezoelectric element illustrated in FIG. 1B includes the piezoelectric material 2 which has a first region having remanent polarization in a downward direction with respect to paper, and a second region having remanent polarization in an upward direction. Examples of a method for confirming that the first region and the second region have different polarities of remanent polarization include a method of determining based on the positive and negative values of the measured piezoelectric constant and a method of determining that shift directions from an origin of a coercive electric field in a P-E hysteresis curve are opposite to each other.

As shown in FIGS. 1B and 1C, the piezoelectric element of the present invention including the first region and the second region which have different polarities of remanent polarization can form a vibrational wave in the circular direction. When an electric field is simultaneously applied to the first region and the second region, one of the regions is extended in the circular direction by the piezoelectric effect, and the other region is contracted.

(Electrode)

The piezoelectric element according to the present invention has the first electrode 1 and the second electrode 3 shown in FIG. 1A or a plurality of electrodes 41 and 42 and the common electrode 5 shown in FIGS. 1B and 1C, and thus piezoelectric drive can be performed to convert electric energy to mechanical energy.

Each of the electrodes includes a conductive layer having a thickness of about 5 nm to 10 μm. The material is not particularly limited as long as it is generally used for piezoelectric elements. Examples thereof include metals such as Ti, Pt, Ta, Ir, Sr, In, Sn, Au, Al, Fe, Cr, Ni, Pd, Ag, Cu, and the like; and compounds of these metals.

The electrode may be composed of one of these materials or layers of two or more of these materials. Also, the electrodes disposed on the piezoelectric element may be composed of different materials.

A method for producing the electrodes is not limited, and the electrodes may be formed by baking a metal paste of silver, sputtering, a vapor deposition method, or the like. Also, the electrodes are not limited to the example shown in FIG. 1B and may be formed by patterning in a desired shape according to demand.

(Polarization)

A polarization method for imparting remanent polarization to the piezoelectric element of the present invention is not particularly limited. Polarization may be performed in the air or in silicone oil. The temperature of polarization is preferably 60° C. to 150° C. but the optimum conditions slightly vary according to the composition of the piezoelectric material constituting the element. The electric field applied for polarization is preferably 0.5 kV/mm to 7.0 kV/mm and more preferably 1.0 kV/mm to 3.0 kV/mm.

(Depolarization Temperature)

In order to prevent a loss of piezoelectric characteristics of the piezoelectric element of the present invention even in a high-temperature atmosphere and to prevent deterioration in the piezoelectric characteristics due to a heating process in a device assembling step and due to the heat generated by device driving, the piezoelectric material of the present invention having a composition with a depolarization temperature of 120° C. or more, preferably 125° C. or more, and more preferably 130° C. or more is selected. The depolarization temperature of the piezoelectric element of the present invention can be controlled by the average valence of Sn, composition parameters v, w, x, y, and z or the Mn content, and crystallinity and micro-scale composition uniformity of the piezoelectric material.

(Measurement of Piezoelectric Constant and Mechanical Quality Factor)

The piezoelectric constant and mechanical quality factor of the piezoelectric element can be determined by calculation from the results of measurement of a resonant frequency and anti-resonant frequency using a commercial impedance analyzer based on Standard of Japan Electronics and information Technology industries Association (JEITA EM-4501). Hereinafter, this method is referred to as the "resonance-antiresonance method".

(Structure of Multilayered Piezoelectric Element)

Next, a multilayered piezoelectric element of the present invention is described.

The multilayered piezoelectric element of the present invention is a multilayered piezoelectric element in which a plurality of piezoelectric material layers and a plurality of electrode layers containing internal electrodes are alternately laminated. Each of the piezoelectric material layers is composed of the piezoelectric material of the present invention and has a region held between the electrode layers, a portion or entirety of the region having remanent polarization.

Figure 2A:
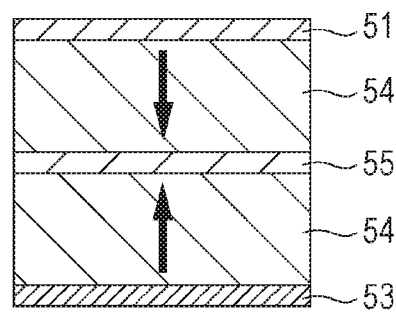
FIGS. 2A and 2B are schematic sectional views showing a configuration of a multilayered piezoelectric element according to an embodiment of the present invention.
Figure 2B:
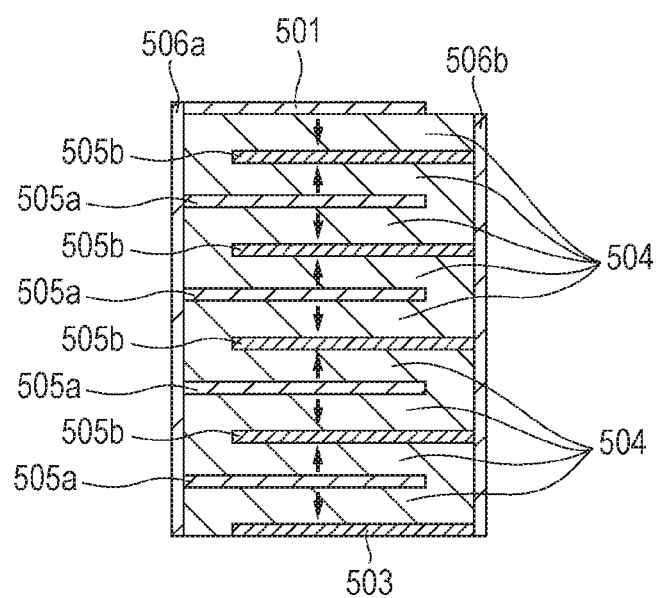

FIGS. 2A and 2B are schematic sectional views each showing a configuration of a multilayered piezoelectric element according to an embodiment of the present invention. The multilayered piezoelectric element of the present invention is a multilayered piezoelectric element in which a piezoelectric material layer 54 and an electrode containing an internal electrode 55 are alternately laminated. The piezoelectric material layer 54 is composed of the piezoelectric material described above. The electrode may include external electrodes such as a first electrode 51 and a second electrode 53 other than the internal electrode 55. In the piezoelectric material layer 54, a portion or entirety of a region held between the electrodes has remanent polarization. An arrow described in the piezoelectric material layer 54 schematically shows the direction of remanent polarization possessed by the piezoelectric material layer. Whether or not the piezoelectric material layer 54 has remanent polarization can be determined by applying an electric field between the electrodes which hold the piezoelectric material layer therebetween and measuring a relation (PE hysteresis curve) between the applied electric field E and polarization amount P. When a portion or entirety of the piezoelectric material layer 54 in the multilayered piezoelectric element of the present invention has remanent polarization in a certain direction (one of the two directions perpendicular to the electrodes), the direction of polarization moment involved in piezoelectric drive is uniform, thereby increasing the piezoelectric strain of the multilayered piezoelectric element.

FIG. 2A shows a configuration of the multilayered piezoelectric element of the present invention in which two piezoelectric material layers 54 and one internal electrode 55 are alternately laminated, and the laminated structure is held between the first electrode 51 and the second electrode 53. However, as shown in FIG. 2B, the number of the piezoelectric layers and the internal electrode may be increased, and the number of layers is not limited. A multilayered piezoelectric element shown in FIG. 2B has a configuration in which nine piezoelectric material layers 504 and eight internal electrodes 505 are alternately laminated, and the laminated structure is held between the first electrode 501 and the second electrode 503. Further, the multilayer piezoelectric element has external electrodes 506a and 506b for short-circuiting the internal electrodes alternately formed. The size and shape of each of the internal electrodes 55 and 505 and the external electrodes 506a and 506b are not necessarily the same as the piezoelectric material layers 54 and 504 and may be divided into a plurality of portions. In each of the piezoelectric material layers 504, a portion or entirety of a region held between the electrodes has remanent polarization.

Of the plurality of piezoelectric material layers, any desired piezoelectric material layer and the adjacent piezoelectric material layer have opposite directions of remanent polarization in the lamination direction. That is, the regions having remanent polarization in the piezoelectric material layers have alternate directions of remanent polarization in the lamination direction. The alternate directions of remanent polarization in the lamination direction can cause a uniform expansion/contraction mode in the piezoelectric material layers when the multilayered piezoelectric element of the present invention is driven, thereby causing a large piezoelectric displacement. For example, in the piezoelectric material layer 54 in FIG. 2A, a region held between the first electrode 51 and the internal electrode 55 and a region held between the second electrode 53 and the internal electrode 55 preferably have different directions of remanent polarization. In the process for manufacturing the multilayered piezoelectric element, when the same plus electric field or minus electric field is applied to the first electrode 51 and the second electrode 53 with the internal electrode 55 at a zero potential, the direction of remanent polarization of the piezoelectric material layer is reversed in the internal electrode 55 as a boundary (when an electrode surface is horizontal, these regions have upward and downward directions of remanent polarization). Similarly, in the piezoelectric material layers 504 having the configuration shown in FIG. 2B, the piezoelectric material layers 504 have alternate directions of remanent polarization with each of the internal electrodes as a boundary as schematically shown by arrows in the drawing.

Each of the internal electrodes 55 and 505, the external electrodes 506a and 506b, the first electrodes 51 and 501, and the second electrodes 53 and 503 includes a conductive layer having a thickness of about 5 nm to 10 μm. The material is not particularly limited as long as it is generally used for piezoelectric elements. Examples thereof include metals such as Ti, Pt, Ta, Ir, Sr, in, Sn, Au, Al, Fe, Cr, Ni, Pd, Ag, Cu, and the like, and compounds thereof. Each of the internal electrodes and the external electrodes may be composed of one of these metals, a mixture or an alloy of two or more, or a laminate, of two or more of these. Also, a plurality of electrodes may be composed of different materials.

In the multilayered piezoelectric element of the present invention, the internal electrodes 55 and 505 contain Ag and Pd, and the weight ratio M1/M2 of content weight M1 Of Ag to content weight M2 of Pd is preferably 0.25≤M1/M2≤4.0 and more preferably 0.3≤M1/M2≤3.0. When the weight ratio M1/M2 is less than 0.25, the sintering temperature of the internal electrodes is undesirably increased. On the other hand, when the weight ratio M1/M2 exceeds 4.0, the internal electrodes become island-like electrodes and undesirably become nonuniform within a plane.

From the viewpoint of low cost of electrode materials, the internal electrodes 55 and 505 preferably contain at least one of Ni and Cu. When at least one of Ni and Cu is used for the internal electrodes 55 and 505, the multilayered piezoelectric element of the present invention is fired in a reducing atmosphere.

As shown in FIG. 2B, the plurality of electrodes including the internal electrodes 505 may be short-circuited for the purpose of making the phases of drive voltages uniform. For example, the internal electrode 505a and the first electrode 501 are short-circuited through the external electrode 506a. Also, the internal electrode 505b and the second electrode 503 are short-circuited through the external electrode 506b. The internal electrodes 505a and the internal electrodes 505b may be alternately disposed. The form of short-circuit between electrodes is not limited. An electrode or wiring for short-circuiting may be provided on a side surface of the multilayered piezoelectric element or a through hole passing through the piezoelectric material layers 504 may be provided and a conductive material may be provided in the hole to short-circuit the electrodes.

(Method for Manufacturing Multilayered Piezoelectric Element)

A method for manufacturing the multilayered piezoelectric element according to the present invention is not particularly limited, but an example of the manufacturing method is described below. A method described as an example includes the step (A) of forming a slurry by dispersing a metal compound powder containing at least Ba, Ca, Sn, Ti, and Zr, and, if required, Mn or Bi, the step (B) of forming a compact by disposing the slurry on a substrate, the step (C) of forming an electrode on the compact, and the step (D) of sintering the compact having the electrode formed thereon to produce the multilayered piezoelectric element.

In the specification, a powder represents a mixture of solid particles. The mixture may simultaneously contain particles of Ba, Ca, Sn, Ti, Zr, Mn, and Bi or contain a plurality of types of particles containing any desired elements.

Examples of the metal compound powder which can be used include powders of the same compounds as those described as the raw materials of the piezoelectric material of the present invention.

An example of a method for forming the slurry in the step (A) is described. A solvent of a weight of 1.6 to 1.7 times the metal compound powder is added and mixed. Examples of the solvent which can be used include toluene, ethanol, a mixed solvent of toluene and ethanol, n-butyl acetate, and water. The resulting mixture is mixed with a ball mill for 24 hours, and then a binder and a plasticizer are added to the mixture. Examples of the binder include PVA (polyvinyl alcohol), PVB (polyvinyl butyral), and acrylic resins. When PVB is used as the binder, PVB is weighed so that the weight ratio between the solvent and PVB is, for example, 88:12. Examples of the plasticizer include dioctyl sebacate, dioctyl phthalate, and dibutyl phthalate. When dibutyl phthalate is used as the plasticizer, the same weight as the binder is weighed. Then, mixing with a ball mill is again performed overnight. The weights of the solvent and the binder are adjusted so that the viscosity of the slurry is 300 to 500 mPa·s.

The compact in the step (B) includes a sheet-shaped mixture of the metal compound powder, the binder, and the plasticizer. A method for producing the compact in the step (B) is, for example, a sheet forming method. A sheet can be formed by, for example, using a doctor blade method. The doctor blade method is a method of forming a sheet-shaped product by applying the slurry on the substrate using a doctor blade and then drying the slurry. For example, a PET film can be used as the substrate. A surface of the PET film on which the slurry is disposed is coated with fluorine to facilitate separation of the compact. Drying may be either natural drying or hot-air drying. The thickness of the compact is not particularly limited and can be controlled according to the thickness of the multilayered piezoelectric element. The thickness of the compact can be increased by, for example, increasing the viscosity of the slurry.

A method of forming the electrodes, such as the internal electrodes 505 and the external electrodes 506a and 506b, in the step (C) is not limited, and the electrodes may be formed by baking a metal paste, sputtering, vapor deposition, printing, or the like. For the purpose of decreasing the drive voltage, the thickness of the piezoelectric material layers 504 and the pitch thereof may be decreased in this case, a process is selected in which a laminate containing a precursor of the piezoelectric material layers 504 and the internal electrodes 505a and 505b is formed, and then simultaneously fired. In this case, the material of the internal electrodes is required to avoid a change of shape and deterioration of conductivity at a temperature necessary for sintering the piezoelectric material layers 504. Also, an anti-reducing material which does not cause significant deterioration of conductivity in a reducing atmosphere is preferably used for the internal electrodes. A metal having a lower melting point and lower cost than Pt, such as Ag, Pd, Au, Cu, or Ni, or an alloy thereof can be used for the internal electrodes 505a and 505b and the external electrodes 506a and 506b. However, the external electrodes 506a and 506b may be provided after firing of the laminate. In this case, Al or a carbonaceous electrode material, in addition to Ag, Pd, Cu, or Ni, can be used.

A screen printing method can be used as the method for forming the electrodes. The screen printing method includes applying, using a spatula, a metal paste on a screen plate disposed on the compact placed on the substrate. A screen mesh is formed in at least a portion of the screen plate. Therefore, the metal paste in the portion where the screen mesh is formed is applied to the compact. The screen mesh in the screen plate preferably has a pattern formed therein. The pattern is transferred to the compact by using the metal paste so that the electrode pattern can be formed on the compact.

After the electrodes are formed in the step (C), the compact is separated from the substrate, and one or a plurality of compacts are laminated and pressure-bonded together. Examples of a pressure bonding method include uniaxial pressure processing, cold hydrostatic processing, and hot hydrostatic processing. The hot hydrostatic processing is preferred because pressure can be isotropically and uniformly applied. During pressure bonding, heating is preferably performed to a temperature near the glass transition temperature of the binder because of good pressure bonding. A plurality of compacts can be laminated to obtain a desired thickness and then pressure-bonded. For example, the laminate can be formed by laminating 10 to 100 compact layers and then heat-pressure-bonding the layers at 50° C. to 80° C. and a pressure of 10 to 60 MPa applied for 10 seconds to 10 minutes in the lamination direction. Also, a plurality of the compacts can be precisely laminated by alignment using an alignment mark added to the electrodes. Of course, a plurality of the compacts can be precisely laminated by providing a positioning through hole in the compacts.

The sintering temperature of the compact in the step (D) is not particularly limited, but is preferably a temperature which causes reaction of the compounds and sufficient crystal growth. The sintering temperature is preferably 1100° C. or more and 1500° C. or less and more preferably 1150° C. or more and 1300° C. or less from the viewpoint that the ceramic grain diameter falls within a range of 0.3 μm to 10 μm. The multilayered piezoelectric element sintered within the above temperature range exhibits good piezoelectric performance. The step (D) can be performed in a furnace capable of atmospheric firing. The binder is removed by burning at a temperature of 200° C. to 500° C. in the air atmosphere, and then the atmosphere is changed to a reducing atmosphere for sintering at a temperature of 1100° C. to 1500° C. and more preferably 1150° C. to 1300° C. The atmosphere is preferably an atmosphere in which an oxygen partial pressure is controlled to $1.0\times10^{-10}$ MPa or more and $1.0\times10^{-8}$ MPa or less for keeping the average valence of Sn element at an intermediate between 2 and 4. When the oxygen partial pressure is lower than $1.0\times10^{-10}$ MPa, the average valence of Sn becomes 2, and thus the piezoelectric characteristics of the piezoelectric material may be degraded. On the other hand, when the oxygen partial pressure is higher than $1.0\times10^{-8}$ MPa, the average valence of Sn becomes 4, and thus the depolarization temperature of the piezoelectric material may be decreased. As described above in the method for producing the piezoelectric material, the multilayered piezoelectric element of the present invention can be produced by previously firing perovskite-type metal oxide intermediates having average valences of 2 and 4 in respective reducing atmospheres, and then mixing the metal oxide intermediates to prepare a slurry in the step (A). The oxygen partial pressure can be calculated from the oxygen concentration measured by a zirconia-type oxygen concentration meter. In order to form the reducing atmosphere, a hydrogen ($H_2$)-containing gas, a water vapor ($H_2O$)-containing gas, or an argon (Ar)-containing gas can be used. Among these gases, the hydrogen-containing gas is most preferably used from the viewpoint of reducibility, specific heat, and thermal conductivity. A hydrogen-nitrogen mixed gas or a hydrogen-nitrogen-water vapor mixed gas may be used. The piezoelectric material layers 504 of the multilayered piezoelectric element sintered in the reducing atmosphere may have oxygen deficiencies. When the piezoelectric material layers 504 have oxygen deficiencies, piezoelectric characteristics may be greatly degraded. Therefore, for the purpose of decreasing oxygen deficiencies, post-heating (post-annealing) may be performed for the multilayered piezoelectric element in an atmosphere with a higher oxygen partial pressure than in main firing. In order to prevent a change of the valence of Sn, the maximum temperature of post-heating is preferably less than 1100° C. The time of heat treatment for post-heating is preferably 1 hour or more because the significant effect of decreasing oxygen deficiencies can be obtained. The heat treatment time of 12 hours or less is preferred because a change of the valence of Sn can be suppressed. After taking out from the firing furnace, a conductive paste is applied to the side surfaces of the element body in which the ends of the internal electrodes are exposed, and then the conductive paste is dried to form the external electrodes. Polarization is performed by using the external electrodes according to the same method as for the piezoelectric element of the present invention.

(Liquid Discharge Head)

A liquid discharge head according to the present invention includes a liquid chamber including a vibration portion in which the piezoelectric element or the multilayered piezoelectric element is disposed, and a discharge port communicating with the liquid chamber.

Figure 3A:
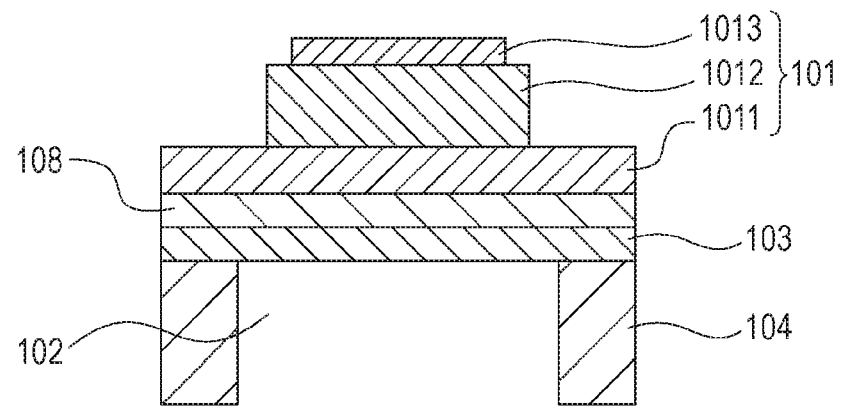
FIGS. 3A and 3B are schematic drawings showing a configuration of a liquid discharge head according to an embodiment of the present invention.
Figure 3B:
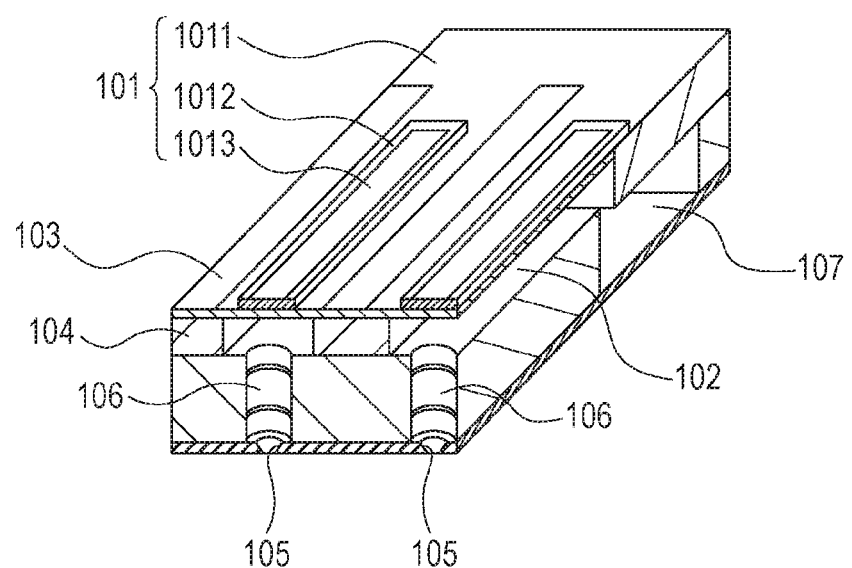

FIGS. 3A and 3B are schematic drawings showing a configuration of a liquid discharge head according to an embodiment of the present invention. As shown in FIGS. 3A and 3B, the liquid discharge head of the present invention includes a piezoelectric element 101 of the present invention. The piezoelectric element 101 includes a first electrode 1011, a piezoelectric material 1012, and a second electrode 1013. As shown in FIG. 3B, if required, the piezoelectric material 1012 is patterned.

FIG. 3B is a schematic drawing showing the liquid discharge head. The liquid discharge head includes a discharge port 105, an individual liquid chamber 102, a communicating hole 106 which connects the individual liquid chamber 102 to the discharge port 105, a liquid chamber partition 104, a common liquid chamber 107, a diaphragm 103, and the piezoelectric element 101. Although, in the drawing, the piezoelectric element 101 has a rectangular shape, the shape may be an elliptical shape, a circular shape, a parallelogram shape, or the like, other than the rectangular shape. The piezoelectric material 1012 generally has a shape corresponding to the shape of the individual liquid chamber 102.

The vicinity of the piezoelectric element 101 contained in the liquid discharge head of the present invention is described in detail with reference to FIG. 3A. FIG. 3A is a sectional view taken along a width direction of the piezoelectric element shown in FIG. 3B. Although the piezoelectric element 101 having a rectangular sectional shape is shown in FIG. 3A, the shape may be a trapezoidal shape or an inverted trapezoidal shape.

In the drawing, the first electrode 1011 is used as a lower electrode, and the second electrode 1013 is used as an upper electrode. However, the arrangement of the first electrode 1011 and the second electrode 1013 is not limited to this. For example, the first electrode 1011 may be used as a lower electrode or an upper electrode. Similarly, the second electrode 1013 may be used as an upper electrode or a lower electrode. Also, a buffer layer 108 may be present between the diaphragm 103 and the lower electrode. In addition, these names vary according to the method for manufacturing a device, and in any of the cases, the effect of the present invention can be obtained.

In the liquid discharge head, the diaphragm 103 oscillates upward and downward due to expansion and contraction of the piezoelectric material 1012 to apply pressure to a liquid in the individual liquid chamber 102. As a result, the liquid is discharged from the discharge port 105. The liquid discharge head of the present invention can be used for application to a printer and for manufacturing an electronic device.

The thickness of the diaphragm 103 is 1.0 μm or more and 15 μm or less and preferably 1.5 μm or more and 8 μm or less. The material of the diaphragm is not limited but is preferably Si. Si of the diaphragm may be doped with boron or phosphorus. In addition, the buffer layer and the electrodes disposed on the diaphragm may be provided as a portion of the diaphragm. The thickness of the buffer layer 108 is 5 nm or more and 300 nm or less and preferably 10 nm or more and 200 nm or less. The size of the discharge port 105 has an equivalent circle diameter of 5 μm or more and 40 μm or less. The shape of the discharge port 105 may be a circular shape, a star shape, a square shape, or a triangular shape.

(Liquid Discharge Apparatus)

Next, a liquid discharge apparatus according to the present invention is described. The liquid discharge apparatus of the present invention includes a stage configured to receive an object and the liquid discharge head.

Figure 4:
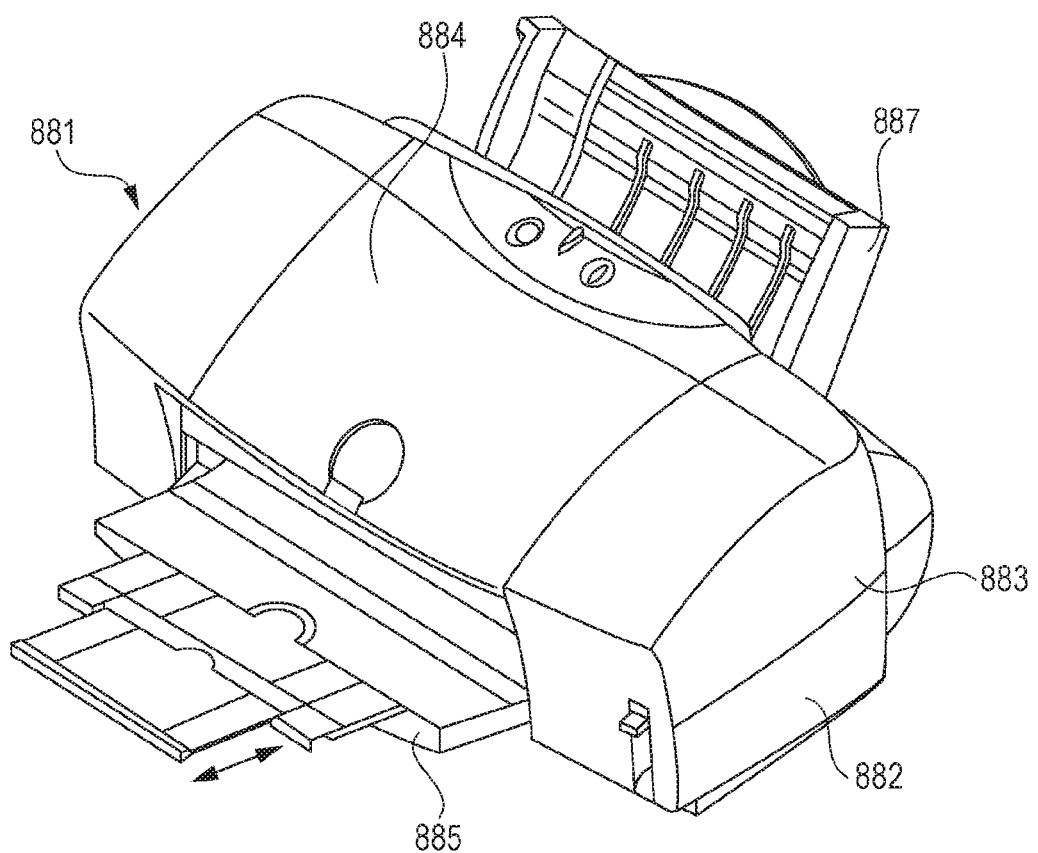
FIG. 4 is a schematic drawing showing a configuration of a liquid discharge apparatus according to an embodiment of the present invention.
Figure 5:
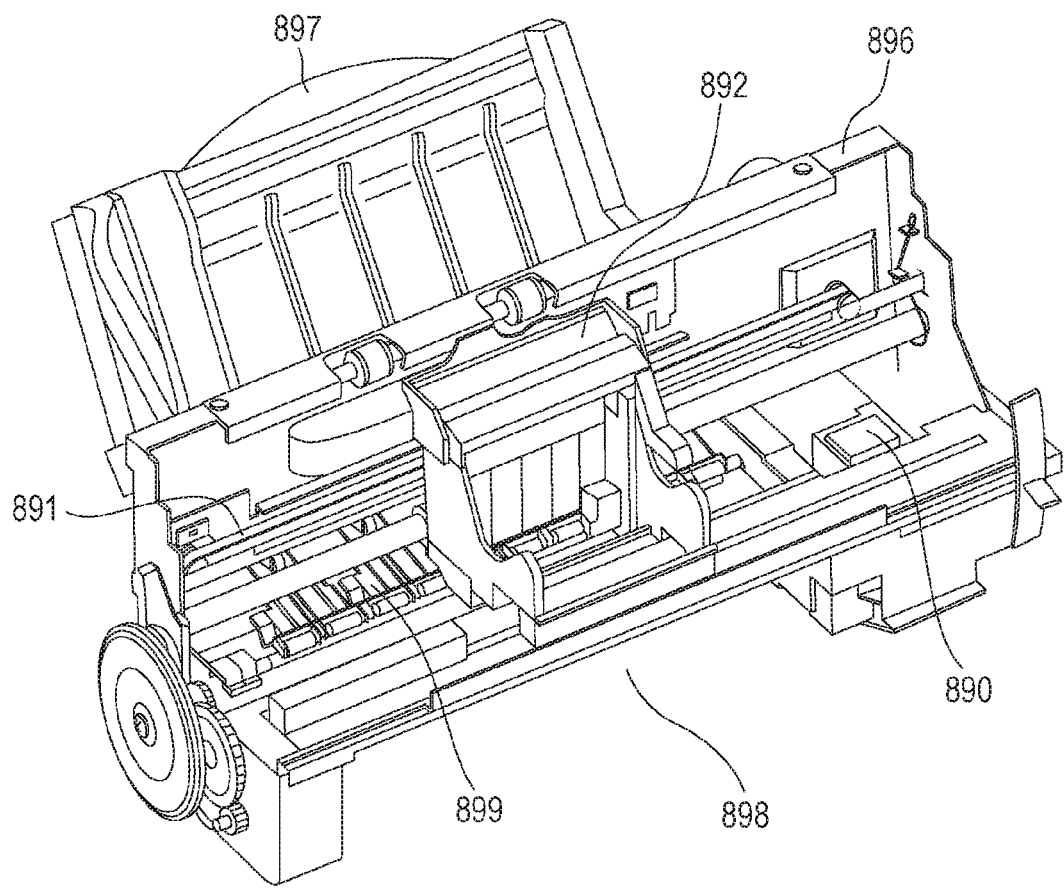
FIG. 5 is a schematic drawing showing a configuration of a liquid discharge apparatus according to an embodiment of the present invention.

An example of the liquid discharge apparatus of the present invention is an ink jet recording apparatus shown in FIGS. 4 and 5. FIG. 5 shows a state in which exteriors 882 to 885 and 887 are removed from a liquid discharge apparatus (ink jet recording apparatus) 881 shown in FIG. 4. The ink jet recording apparatus 881 includes, an automatic feed portion 897 which automatically feeds recording paper as a transfer member into an apparatus body 896. Further, the ink jet recording apparatus 881 includes a transfer portion 899 which guides the recording paper sent from the automatic feed portion 897 to a predetermined recording position and guides from the recording position to an outlet port 898 and which serves as a mounting portion for the transfer member, a recording portion 891 which performs recording on the recording paper transferred to the recording position, and a recovery portion 890 which performs recovery treatment of the recording portion 891. The recording portion 891 is provided with a carriage 892 which holds the liquid discharge head of the present invention therein and which is reciprocated on a rail.

In the ink jet recording apparatus, the carriage 892 is moved on the rail according to an electric signal transmitted from a computer. When a drive voltage is applied to the electrodes which hold the piezoelectric material therebetween, the piezoelectric material is displaced. The displacement of the piezoelectric material applies pressure to the individual liquid chamber 102 through the diaphragm 103 shown in FIG. 3B and discharges ink from the discharge port 105, thereby performing printing.

The liquid discharge apparatus of the present invention can uniformly discharge a liquid at a high speed and can be reduced in size.

Although, in the above-described example, the liquid discharge apparatus of the present invention is used as a printer, the liquid discharge apparatus can be used as an ink jet recording apparatus of a facsimile, a composite machine, or a copying machine, and as an industrial liquid discharge apparatus.

In addition, the user can select a desired transfer member according to application. In another configuration, the liquid discharge head may be moved relatively to the transfer member placed on a stage serving as the stage configured to receive an object.

(Ultrasonic Motor)

Next, an ultrasonic motor according to the present invention is described. The ultrasonic motor according to the present invention includes a vibrating body in which the piezoelectric element or the multilayered piezoelectric element is disposed, and a moving body in contact with the vibrating body.

Figure 6A:
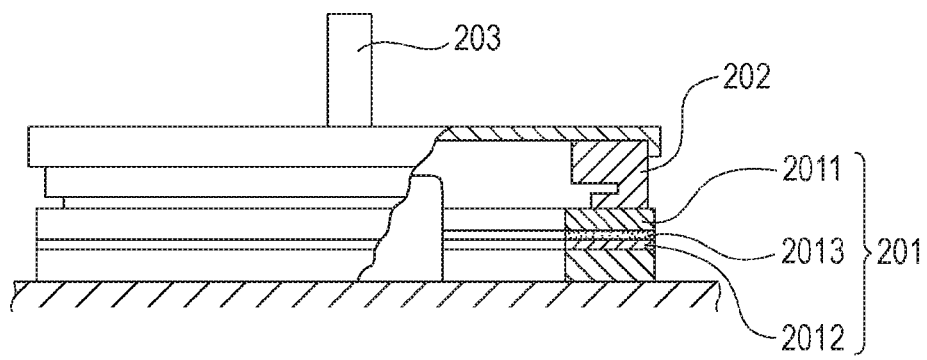
FIGS. 6A and 6B are schematic drawings showing a configuration of an ultrasonic motor according to an embodiment of the present invention.
Figure 6B:
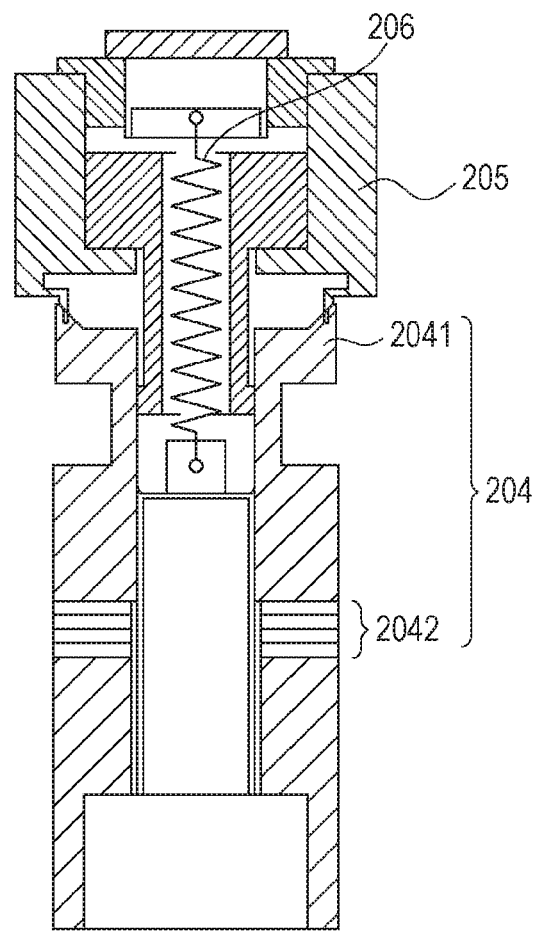

FIGS. 6A and 6B are schematic drawings each showing a configuration of an ultrasonic motor according to an embodiment of the present invention. FIG. 6A shows an ultrasonic motor including the piezoelectric element of the present invention which includes a single plate. The ultrasonic motor includes an oscillator 201, a rotor 202 in contact with a sliding surface of the oscillator 201 due to the pressure produced by a pressure spring (not shown), and an output axis 203 provided integrally with the rotor 202. The oscillator 201 includes an elastic metal ring 2011, a piezoelectric element 2012 of the present invention, and an organic adhesive 2013 (epoxy-based, cyanoacrylate-based, or the like) which bonds the piezoelectric element 2012 to the elastic ring 2011. The piezoelectric element 2012 of the present invention includes a piezoelectric material held between a first electrode and a second electrode (not shown).

When an alternating voltage with two phases which are different by an odd multiple of $\Pi/2$ is applied to the piezoelectric element of the present invention, a flexural progressive wave is generated in the oscillator 201, and each point on the sliding surface of the oscillator 201 makes an elliptical movement. When the rotor 202 is in pressure contact with the sliding surface of the oscillator 201, the rotor 202 receives frictional force from the oscillator 201 and rotates in the direction opposite to the flexural progressive wave. A driven body (not shown) is bonded to the output axis 203 and driven by the rotational force of the rotor 202.

When a voltage is applied to the piezoelectric material, the piezoelectric material expands and contracts by the transverse piezoelectric effect. When an elastic material such as a metal is bonded to the piezoelectric element, the elastic material is bent by expansion and contraction of the piezoelectric element. The ultrasonic motor of the type described above uses this principle.

Next, an ultrasonic motor including a piezoelectric element having a multilayered structure is shown as an example in FIG. 6B. An oscillator 204 includes a multilayered piezoelectric element 2042 held in a cylindrical metal elastic body 2041. The multilayered piezoelectric element 2042 is composed of a plurality of laminated piezoelectric materials (not shown) and induces a first electrode and second electrode provided on outer surfaces of the laminate and an internal electrode provided on an inner surface of the laminate. The metal elastic body 2041 is fastened with a bolt to hold and fix the multilayered piezoelectric element 2042, forming the oscillator 204.

When alternating voltages having different phases are applied to the multilayered piezoelectric element 2042, the oscillator 204 excites two vibrations perpendicular to each other. The two vibrations are combined to form circular vibration for driving an end portion of the oscillator 204. In addition, a peripheral groove with a smaller diameter is formed in an upper portion of the oscillator 204 to increase a displacement of vibration for driving.

The rotor 205 is brought into pressure contact with the oscillator 204 by the pressure spring 206, and thus frictional force for driving is produced. The rotor 205 is rotatably supported by a bear ring.

(Optical Apparatus)

Next, an optical apparatus of the present invention is described. An optical apparatus according to the present invention includes the ultrasonic motor provided on a drive unit.

Figure 7A:
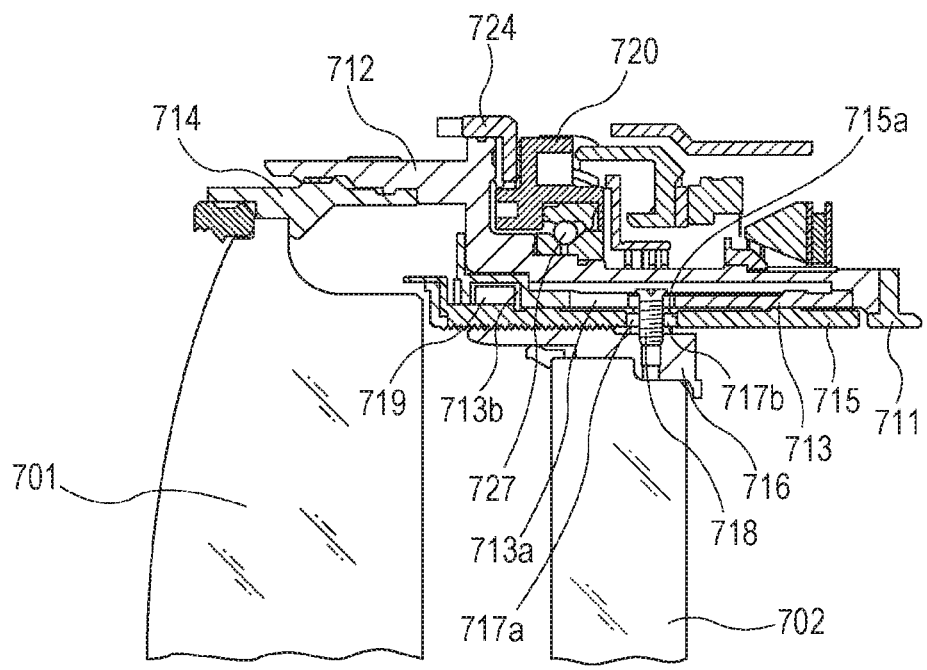
FIGS. 7A and 7B are schematic drawings showing an optical apparatus according to an embodiment of the present invention.
Figure 7B:
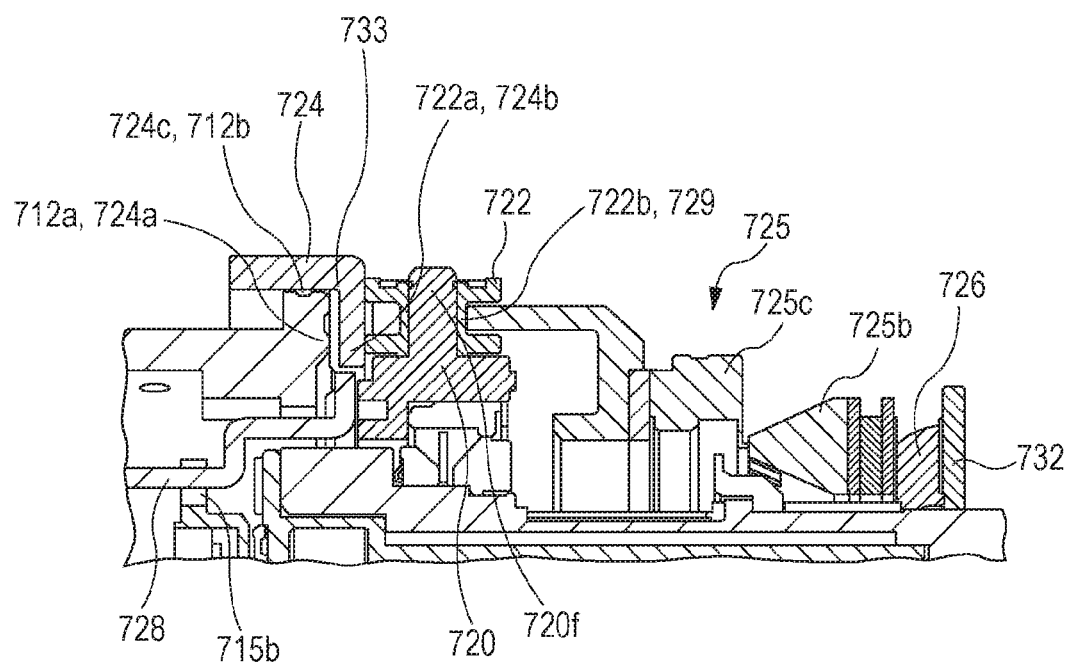
Figure 8:
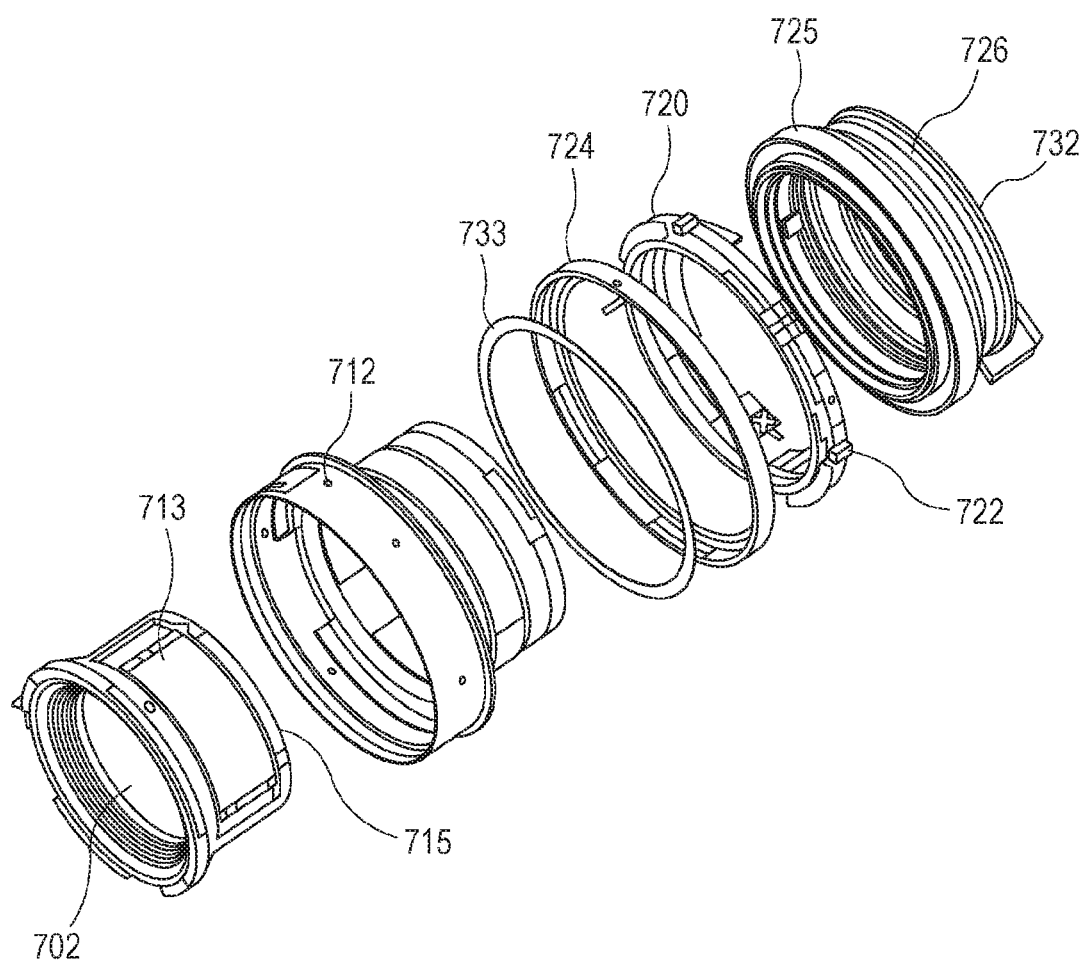
FIG. 8 is a schematic drawing showing an optical apparatus according to an embodiment of the present invention.

FIGS. 7A and 7B are principal sectional views of an interchangeable lens barrel of a single-lens reflex camera as an example of an optical apparatus according to a preferred embodiment of the present invention. FIG. 8 is an exploded perspective view of an interchangeable lens barrel of a single-lens reflex camera as an example of an optical apparatus according to a preferred embodiment of the present invention. A fixed barrel 712, a straight advance guiding barrel 713, and a front-group barrel 714 are fixed to a detachable mount 711 of the camera. These are fixed members of the interchangeable lens barrel.

In the straight advance guiding barrel 713, a straight advance guiding groove 713a in the optical axis direction for a focus lens 702 is formed. In addition, cam rollers 717a and 717b projecting outward in the radius direction are fixed, with an axial screw 718, to a rear-group barrel 716 which holds the focus lens 702, and the cam roller 717a is fit into the straight advance guiding groove 713a.

Further, a cam ring 715 is rotatably fit into the inner periphery of the straight advance guiding barrel 713. In the straight advance guiding barrel 713 and the cam ring 715, a roller 719 fixed to the cam ring 715 is fit into the peripheral groove 713b of the straight advance guiding barrel 713 so as to regulate relative movement in the optical axis direction. In addition, a cam groove 715a for the focus lens 702 is formed in the cam ring 715, and the cam roller 717b is fit into the cam groove 715a.

Further, a rotation transmission ring 720 is disposed on the outer peripheral side of the fixed barrel 712 so as to be rotatably held at a fixed position with respect to the fixed barrel 712 by using a ball race 727. In addition, a roller 722 is rotatably held on an axis 720f radially extending from the rotation transmission ring 720, and a large-diameter portion 722a of the roller 722 is in contact with the mount-side end surface 724b of a manual focus ring 724. Also, a small-diameter portion 722b of the roller 722 is in contact with a joint member 729. The six rollers 722 are disposed at equal intervals on the periphery of the rotation transmission ring 720, and each of the rollers is configured to have the above-described relation.

A low-friction sheet (washer member) 733 is disposed in the inner-diameter portion of the manual focus ring 724, and the low-friction sheet is held between the mount-side end surface 712a of the fixed barrel 712 and the front-side end surface 724a of the manual focus ring 724. In addition, the outer-diameter surface of the low-friction sheet 733 has a ring shape and is radially engaged with the inner diameter 724c of the manual focus ring 724, and the inner diameter 724c of the manual focus ring 724 is radially engaged with the outer-diameter portion 712b of the fixed barrel 712. The low-friction sheet 733 functions to decrease friction in a rotational ring mechanism in which the manual focus ring 724 relatively rotates around the optical axis with respect to the fixed barrel 712.

The large-diameter portion 722a of the roller 722 is, under the pressure applied thereto, in contact with the mount-side end surface 724b of the manual focus ring 724 by the force of the wave washer 726 to press the ultrasonic motor 725 in the forward direction of lens. Similarly, the small-diameter portion 722b of the roller 722 is, under the appropriate pressure applied, in contact with the joint member 729 by the force of the wave washer 726 to press the ultrasonic motor 725 in the forward direction of the lens. Movement of the wave washer 726 in the mount direction is regulated by a washer 732 bayonet-coupled to the fixed barrel 712, and the spring force (energizing force) generated by the wave washer 726 is transmitted to the ultrasonic motor 725 and further to the roller 722 to generate a pressing force of pressing the mount-side end surface 712a of the fixed barrel 712 by the manual force ring 724. That is, the manual focus ring 724 is installed in a state of being pressed by the mount-side end surface 712a of the fixed barrel 712 through the low-friction sheet 733.

Therefore, when the fixed, barrel 712 is rotationally driven with respect to the fixed barrel 712 by a control portion (not shown), the roller 722 rotates around the axis 720f because of frictional contact between the joint member 729 and the small-diameter portion 722b of the roller 722. As a result, the rotation transmission ring 720 rotates around the optical axis (autofocus operation).

Also, when a rotational force around the optical axis is applied to the manual focus ring 724 from a manual operation input portion (not shown), the roller 722 rotates around the axis 720f due to frictional force because of pressure contact between the mount-side end surface 724b of the manual focus ring 724 and the large-diameter portion 722a of the roller 722. When the large-diameter portion 722a of the roller 722 rotates around the axis 720f, the rotation transmission ring 720 rotates around the optical axis. In this state, the ultrasonic motor 725 does not rotate due to the friction retention of the rotor 725c and the stator 725b (manual focus operation).

In addition, two focus keys 728 are provided in opposite directions on the rotation transmission ring 720, and the focus keys 728 are engaged with a notch portion 715b provided at the end of the cam ring 715. Therefore, when the rotation transmission ring 720 is rotated by an autofocus operation or manual focus operation, the rotational force is transmitted to the cam ring 715 through the focus keys 728. When the cam ring is rotated around the optical axis, the rear-group barrel 716 in which rotation is regulated by the cam roller 717a and the straight advance guiding groove 713a moves forward and backward along the cam groove 715a of the cam ring 715 by the cam roller 717b. As a result, the focus lens 702 is driven to perform a focus operation.

Although the interchangeable lens barrel of a single-lens reflex camera is described above as the optical apparatus of the present invention, the present invention can be applied to any types of cameras such as a compact camera, an electronic still camera, and the like, and an optical apparatus including an ultrasonic motor provided in a drive unit.
(Oscillatory Apparatus and Dust Removing Apparatus)

An oscillatory apparatus used for transporting or removing particles, a powder, or a liquid is widely used for an electronic apparatus and the like. A dust removing apparatus including the piezoelectric element of the present invention is described below as an example of an oscillatory apparatus of the present invention.

A dust removing apparatus according to the present invention includes a vibrating body in which the piezoelectric element or the multilayered piezoelectric element is disposed on a diaphragm so as to have the function of removing dust adhering to a surface of the diaphragm.

Figure 9A:
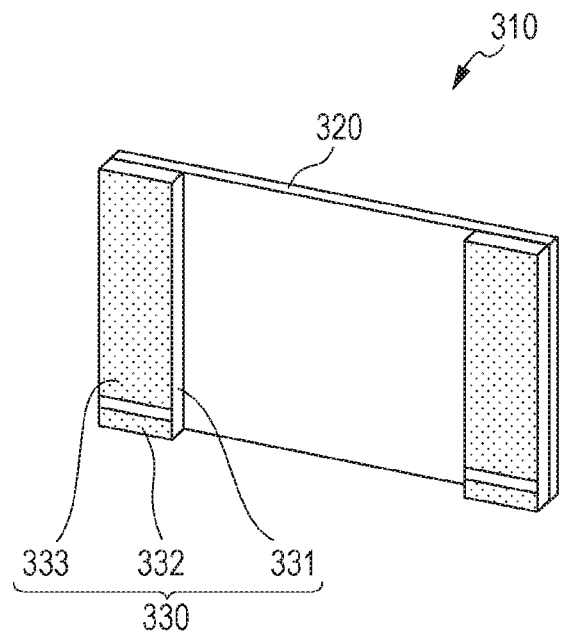
FIGS. 9A and 9B are schematic drawings showing a dust removing apparatus according to an embodiment of the present invention.
Figure 9B:
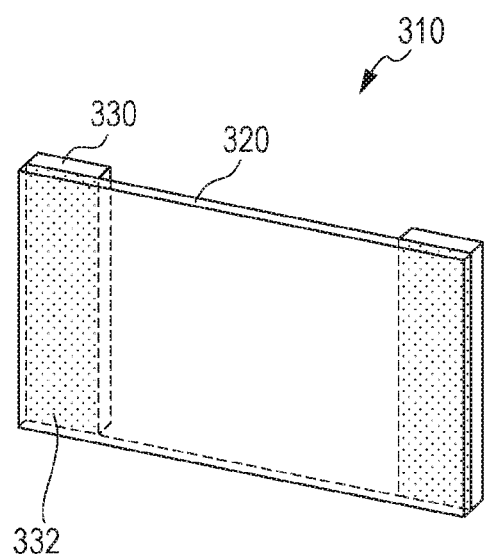

FIGS. 9A and 9B are schematic drawings showing a dust removing apparatus according to an embodiment of the present invention. A dust removing apparatus 310 includes a plate-shaped piezoelectric element 330 and a diaphragm 320. The piezoelectric element 330 may be the multilayered piezoelectric element of the present invention. The material of the diaphragm 320 is not limited, but when the dust removing apparatus 310 is used in an optical device, a transmissive material or a reflective material can be used for the diaphragm 320 so that a transmissive portion or reflective portion of the diaphragm is an object of dust removal.

Figure 10A:
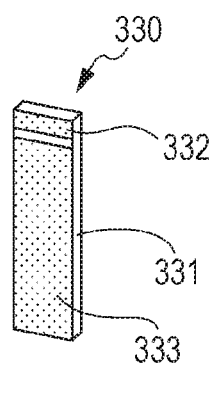
FIGS. 10A to 10C are schematic drawings showing a configuration of a piezoelectric element in a dust removing apparatus according to an embodiment of the present invention.
Figure 10B:
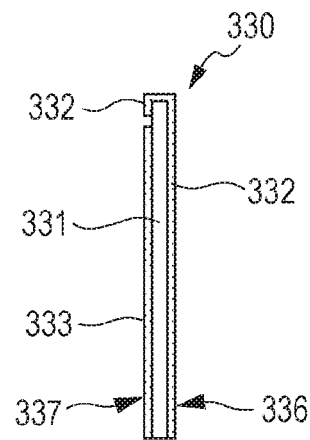
Figure 10C:
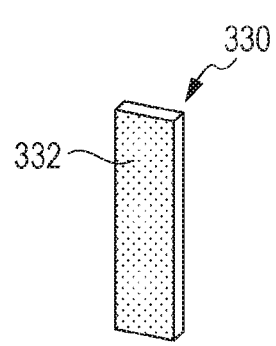

FIGS. 10A to 10C are schematic drawings showing a configuration of the piezoelectric element 330 shown in FIGS. 9A and 9B. FIGS. 10A and 10C show a configuration of the front and hack surfaces of the piezoelectric element 330, respectively, and FIG. 10B shows the side surface thereof. As shown in FIGS. 9A and 9B and FIGS. 10A to 10C, the piezoelectric element 330 includes a piezoelectric material 331, a first electrode 332, and a second electrode 333, the first electrode 332 and the second electrode 333 being disposed to face the surfaces of the piezoelectric material 331. Like in FIGS. 9A and 9B, the piezoelectric element 330 may be the multilayered piezoelectric element of the present invention. In this case, the piezoelectric material 331 has a structure in which piezoelectric material layers and internal electrodes are alternately disposed, and the internal electrodes are alternately short-circuited to the first electrode 332 and the second electrode 333 to produce drive waveforms with different phases for the piezoelectric material layers. In FIG. 10C, a front surface of the piezoelectric element 330 on which the first electrode 332 is disposed is referred to as a "first electrode surface 336" and in FIG. 10A, a front surface of the piezoelectric element 330 on which the second electrode 333 is disposed is referred to as a "second electrode surface 337".

The term "electrode surface" represents a surface of a piezoelectric element on which an electrode is disposed and, for example, as shown in FIGS. 10A to 10C, the first electrode 332 may be extended to the second electrode surface 337.

As shown in FIGS. 9A and 9B, in the piezoelectric element 330 and the diaphragm 320, the first electrode surface 336 of the piezoelectric element 330 is fixed to the plate surface of the diaphragm 320. The piezoelectric element 330 is driven to generate stress between the piezoelectric element 330 and the diaphragm 320, thereby producing out-of-plane vibration in the diaphragm 320. The dust removing apparatus 310 of the present invention is an apparatus for removing, by out-of-plane vibration of the diaphragm 320, foreign matters such as dust adhering to the surface of the diaphragm 320. The out-of-plane vibration represents elastic vibration that displaces the diaphragm in the optical axis direction, that is, in the thickness direction of the diaphragm.

Figure 11A:
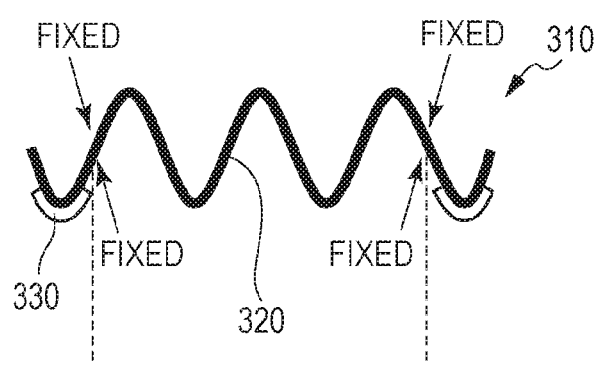
FIGS. 11A and 11B are schematic drawings showing the vibration principle of a dust removing apparatus according to an embodiment of the present invention.
Figure 11B:
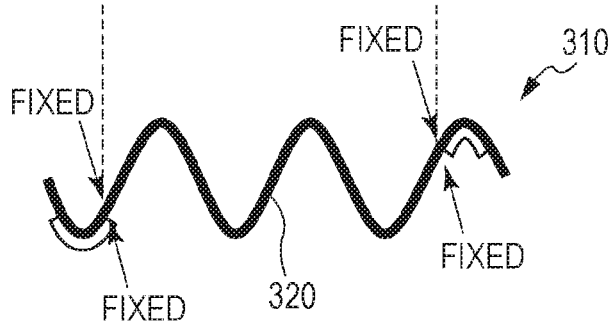

FIGS. 11A and 11B are schematic drawings showing the vibration principle of the dust removing apparatus 310 of the present invention. FIG. 11A shows a state in which out-of-plane vibration is produced in the diaphragm 320 by applying alternating voltages with the same phase to a pair of right and left piezoelectric elements 330. The polarization direction of the piezoelectric material constituting the pair of right and left piezoelectric elements 330 is the same as the thickness direction of the piezoelectric elements 330, and the dust removing apparatus 310 is driven in a 7th order vibration mode. FIG. 11B shows a state in which out-ofplane vibration is produced in the diaphragm 320 by applying alternating voltages with reverse phases, which are 180° reverse to each other, to a pair of right and left piezoelectric elements 330. The dust removing apparatus 310 is driven in a 6-th order vibration mode. The dust removing apparatus 310 of the present invention can effectively remove dust adhering to the surface of the diaphragm by properly using at least two vibration modes.

(Image Pick-Up Apparatus)

Figure 12:
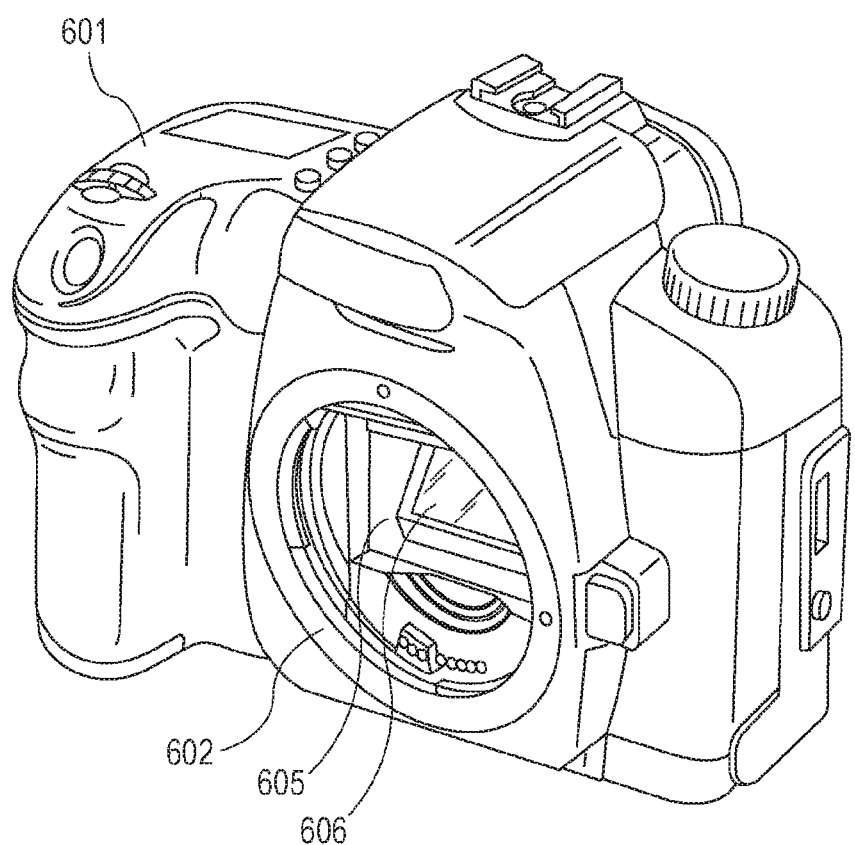
FIG. 12 is a schematic drawing showing an image pick-up apparatus according to an embodiment of the present invention.
Figure 13:
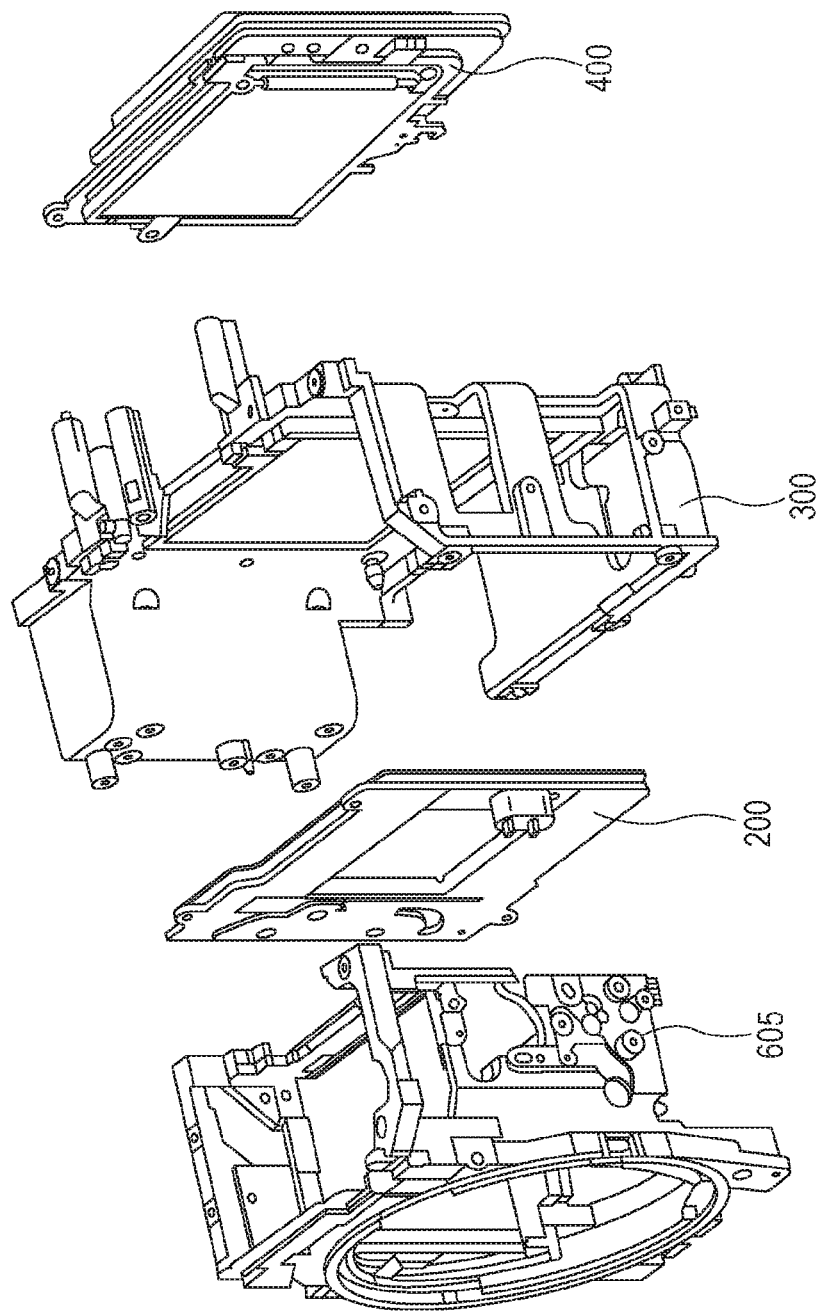
FIG. 13 is a schematic drawing showing an image pick-up apparatus according to an embodiment of the present invention.

Next, an image pick-up apparatus according to the present invention is described. The image pick-up apparatus of the present invention includes the dust removing apparatus and an image pick-up element unit, wherein the diaphragm of the dust removing apparatus is provided on the light-receiving surface side of the image pick-up element unit. FIGS. 12 and 13 are schematic drawings showing a digital single-lens reflex camera as an example of an image pick-up apparatus according to an embodiment of the present invention.

FIG. 12 is a perspective front view of a camera body 601 as viewed, from the object side, in which a photographic lens unit is removed. FIG. 13 is an exploded perspective view showing a schematic configuration in the camera for explaining a peripheral structure of the dust removing apparatus of the present invention and an image pick-up unit 400.

A mirror box 605 to which a photographic light flux transmitted through the photographic lens is guided is provided in the camera body 601 shown in FIG. 12, and a main mirror (quick return mirror) 606 is disposed in the mirror box 605. The main mirror 606 can take a state where it is held at an angle of 45° with the photographic light axis in order to guide the photographic light flux to a penta-dach mirror (not shown) and a state where it is held at a position retracted from the photographic light flux in order to guide to the image pick-up element (not shown).

In FIG. 13, the mirror box 605 and a shutter unit 200 are disposed on the object side of a body chassis 300 serving as a skeleton of the camera body so as to be arranged in order from the object side. Also, the image pick-up unit 400 is disposed on the photographer side of the body chassis 300. The image pick-up unit 400 includes the diaphragm of the dust removing apparatus and the image pick-up element unit. The diaphragm of the dust removing apparatus is provided on the same axis as the light-receiving surface of the image pick-up element unit. The image pick-up unit 400 is installed on a mount surface of a mount portion 602 (FIG. 12) serving as a reference of mounting of the photograph lens unit and adjusted so that the image pick-up surface of the image pick-up element unit is at a predetermined distance from the photographic lens unit and is parallel with the photographic lens unit.

Although the digital single-lens reflex camera is described as the image pick-up apparatus of the present invention, the image pick-up apparatus may be applied to, for example, a photographic lens unit interchangeable camera such as a mirror-less digital single-lens camera not including the mirror box 605. The image pick-up apparatus can be applied to various image pick-up apparatuses such as a photographic lens unit interchangeable video camera, a copying machine, a facsimile, a scanner, and the like, or electronic-electric apparatuses including an image pick-up apparatus, particularly an apparatus in which it is necessary to remove dust adhering to a surface of an optical component.

(Electronic Apparatus)

Next, an electronic apparatus of the present invention is described. The electronic apparatus of the present invention includes a piezoelectric acoustic component including the piezoelectric element or the multilayered piezoelectric element. Examples of the piezoelectric acoustic component include a speaker, a buzzer, a microphone, and a surface acoustic wave (SAW) element.

Figure 14:
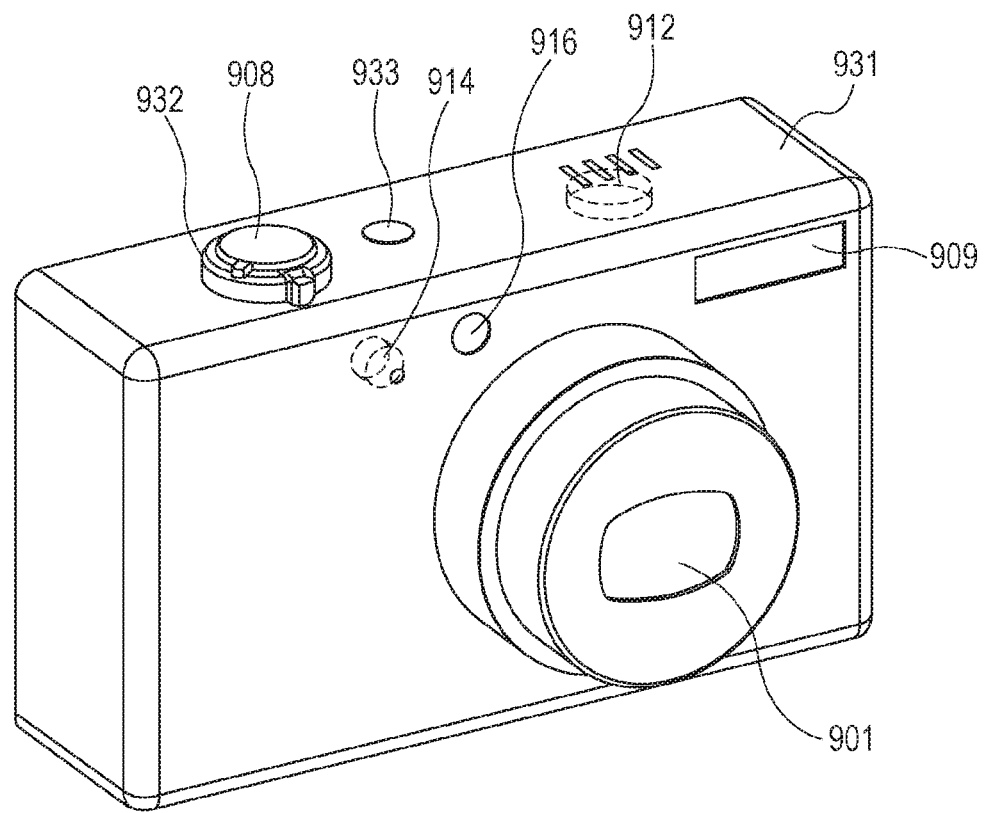
FIG. 14 is a schematic drawing showing an electronic apparatus according to an embodiment of the present invention.

FIG. 14 is a perspective front view showing the whole of a body 931 of a digital camera as an example of an electronic apparatus according to an embodiment of the present invention. An optical apparatus 901, a microphone 914, a strobe light-emitting portion 909, and an auxiliary light portion 916 are disposed on the front surface of the body 931. The microphone 914 is installed in the body and thus shown by broken lines. In addition, a hole is provided in front of the microphone 914 in order to pick up a sound from the outside.

Further, a power supply button 933, a speaker 912, a zoom lever 932, and a release button 908 for performing a focusing operation are disposed on the upper surface of the body 931. The speaker 912 is installed in the body 931 and is thus shown by broken lines. Further, a hole is provided in front of the speaker 912 in order to transmit a sound to the outside.

The piezoelectric acoustic component of the present invention is used for at least one of the microphone 914, the speaker 912, and the surface acoustic wave element.

Although the digital camera is described as the electronic apparatus of the present invention, the electronic apparatus of the present invention cart be applied to electronic apparatuses having various piezoelectric acoustic components, such as a sound regeneration apparatus, a sound recording apparatus, a cellular phone, an information terminal, etc.

As described above, the piezoelectric element and the multilayered piezoelectric element of the present invention can be used for a liquid discharge head, a liquid discharge apparatus, an ultrasonic motor, an optical apparatus, an oscillatory apparatus, a dust removing apparatus, an image pick-up apparatus, and an electronic apparatus.

By using the lead-free piezoelectric element of the present invention, a liquid discharge head having a nozzle density and discharge force equivalent to or higher than the case of use of a piezoelectric element containing lead can be provided.

By using the lead-free piezoelectric element of the present invention, a liquid discharge apparatus having a discharge speed and discharge precision equivalent to or higher than the case of use of a piezoelectric element containing lead can be provided.

By using the lead-free piezoelectric element of the present invention, an ultrasonic motor having a drive force and durability equivalent to or higher than the case of use of a piezoelectric element containing lead can be provided.

By using the lead-free piezoelectric element of the present invention, an optical apparatus having durability and operation precision equivalent to or higher than the case of use of a piezoelectric element containing lead can be provided.

By using the lead-free piezoelectric element of the present invention, an oscillatory apparatus having a vibration ability and durability equivalent to or higher than the case of use of a piezoelectric element containing lead can be provided.

By using the lead-free piezoelectric element of the present invention, a dust removing apparatus having a removal efficiency equivalent to or higher than the case of use of a piezoelectric element containing lead can be provided.

By using the lead-free piezoelectric element of the present invention, an image pick-up apparatus having a dust removing function equivalent to or higher than the case of use of a piezoelectric element containing lead can be provided.

By using a piezoelectric acoustic component including the lead-free piezoelectric element of the present invention, an electronic apparatus having sound generation properties equivalent to or higher than the case of use of a piezoelectric element containing lead can be provided.

Also, the piezoelectric element and the multilayered piezoelectric element of the present invention can be used for general piezoelectric actuators which may be exposed to a high-temperature atmosphere, for example, an environment of 85° C. or less.

EXAMPLES

The present invention is described in further detail below with reference to examples, but the present invention is not limited to these examples.

A piezoelectric material and piezoelectric element of the present invention were produced as described below.
(Piezoelectric Material and Piezoelectric Element of the Present Invention)

Example 1

Raw materials corresponding to the composition, $(Ba_{0.810}Ca_{0.140}Sn_{0.380}Ti_{0.940}Zr_{0.030})O_3$ of the general formula $(Ba_vCa_wSn_xTi_yZr_z)O_3$ wherein v=0.810, w=0.140, x=0.080, y=0.940, and z=0.030 were weighed according to procedures described below.

A commercial tin(II) oxide powder (average particle diameter of 600 nm, purity of 99.5% or more) was used as a Sn raw material, and a barium titanate powder (average particle diameter of 100 nm, purity of 99.999% or more) having a perovskite structure produced by a solid-phase method, a perovskite calcium titanate powder (average particle diameter of 300 nm, purity of 99.999% or more), and a perovskite calcium zirconate powder (average particle diameter of 300 nm, purity of 99.999% or more) were used as raw materials of Ba, Ca, Ti, and Zr. These raw materials were weighed so that the Ba, Ca, Sn, Ti, and Zr ratios satisfied the composition $(Ba_{0.810}Ca_{0.140}Sn_{0.080}Ti_{0.940}Zr_{0.030})O_3$. Manganese dioxide containing 0.180 parts by weight of Mn in terms of metal as the first sub-component relative to 100 parts by weight of the composition $(Ba_{0.810}Ca_{0.140}Sn_{0.080}Ti_{0.940}Zr_{0.030})O_3$ was weighed. Similarly, bismuth dioxide containing 0.260 parts by weight of Bi in term of metal as the second sub-component was weighed.

These weighed powders were dry-mixed by using a ball mill for 24 hours. As a result of measurement of the amount of Mg contained in the resultant mixed powder by ICP emission spectrometry, 0.0001 parts by weight of Mg relative to 100 parts by weight of the raw material powder was contained. In order to granulate the mixed powder, 3 parts by weight of PVA binder relative to the mixed powder was adhered to the surfaces of the mixed powder particles by using a spray dryer.

Next, a mold was filled with the resultant granulated powder, and a molding pressure of 200 MPa was applied by using a press molding machine to produce a disk-shaped compact.

The resultant compact was placed in an atmosphere-changeable electric furnace and heated at 400° C. in the air atmosphere to remove the organic binder component. Next, the gas introduced was changed to a hydrogen-nitrogen mixed gas in the same electric furnace, the oxygen partial pressure was controlled to $1.0 \times 10^{-8}$ MPa, and then the compact was maintained at the maximum temperature of 1380° C. for 5 hours. Next, the temperature was decreased to 1100° C. at the same oxygen partial pressure, the oxygen partial pressure was increased to $3.0 \times 10^{-4}$ MPa, and then the temperature was decreased to 300° C., producing a disk-shaped sintered body (polycrystalline ceramic).

The average equivalent circle diameter and relative density of crystal grains constituting the piezoelectric material were evaluated. As a result, the average equivalent circle diameter was 3.3 μm and the relative density was 99.1%. The observation of the crystal grains was mainly performed by using a polarization microscope. In order to specify the grain diameter of small crystal grains, a scanning electron microscope (SEM) was used. The average equivalent circle diameter was calculated by image processing of the observed image. Also, the relative density was evaluated by the Archimedes method.

Next, the resultant piezoelectric material was polished to have a thickness of 0.5 mm, and a crystal structure of a polished surface was analyzed by X-ray diffraction at room temperature (27° C.). As a result, a peak corresponding to a tetragonal perovskite structure was observed as a single phase.

Also, the composition of the piezoelectric material was evaluated by fluorescence X-ray analysis. As a result, it was found that the piezoelectric material of this example contains, as a main component, a metal oxide represented by the chemical formula $(Ba_{0.810}Ca_{0.140}Sn_{0.080}Ti_{0.940}Zr_{0.030})O_3$, and 0.180 parts by weight of Mn as the first sub-component, 0.260 parts by weight of Bi as the second sub-component, and 0.0001 parts by weight of Mg as the third sub-component relative to 100 parts by weight of the main component. The other fourth sub-component was not detected. The Mg component is considered to be derived from the raw materials. The other metal components of the composition after sintering were the same as the weighed composition. Also, the average equivalent circle diameter after sintering was substantially the same as that after polishing.

Next, the polished surface of the piezoelectric material of this example was further buffed with colloidal silica. After buffing, measurement of surface roughness Ra with a contact surface profiler (manufactured by KLA Tencor Corporation: P-16+) showed Ra=170 nm. As a result of measurement of a narrow spectrum within a range corresponding bond energy of Sn hound electrons by using an X-ray photoelectron spectroscopic apparatus, a peak corresponding a mixture of divalent Sn and tetravalent Sn was observed, and the average valence of Sn was confirmed to lie between 2 and 4. The peak was separated into peaks of divalent Sn and tetravalent Sn, and the area ratio between the peaks was calculated. Consequently, it was found that divalent Sn and tetravalent Sn are present at a ratio of 5:3. Therefore, the average valence of Sn contained in the piezoelectric material of this example was 2.8, and the parameters in the general formula (2) were xa=0.050 and xb=0.030. That is, the main component of the piezoelectric material of this example can be represented by the chemical formula $(Ba_{0.810}Ca_{0.140}Sn_{0.050})(Sn_{0.030}Ti_{0.940}Zr_{0.030})O_3$.

The piezoelectric material of this example was polished in a glove box in an argon atmosphere, sealed in a metal case, and subjected to $^{119}$Sn Nossbauer measurement at room temperature and the atmospheric pressure. Even when the average valence was calculated by fitting on the assumption of a symmetric Lorentz peak, the average valence of Sn was 2.8.

Next, a piezoelectric element of the present invention was formed. Then, gold electrodes having a thickness of 400 nm were formed on the front and back surfaces of the disk-shaped piezoelectric material by a DC sputtering method. In addition, titanium was deposited to form an adhesive layer of 30 nm between each of the electrodes and the piezoelectric material. The piezoelectric material with the electrodes was cut to form a strip-shaped element of 10 mm×2.5 mm×0.5 mm. The element was placed on a hot plate of a surface temperature of 110° C. to 140° C., and polarization was performed by applying an electric field of 1.2 kV/mm between the electrodes for 30 minutes. Consequently, a piezoelectric element of the present invention was produced, in which the piezoelectric material had remanent polarization perpendicular to the electrode surfaces in a portion held between the electrodes.

Examples 2 to 16

Piezoelectric materials and piezoelectric elements of Examples 2 to 16 were formed by the same process as in Example 1. However, the weighed ratio of each of the components in the raw materials of the piezoelectric material was as shown in Table 1. For a piezoelectric material having a higher Zr ratio (z) than Ca ratio (x), perovskite barium zirconate (average particle diameter of 300 nm, purity of 99.999% or more) produced by a solid-phase method was used in place of perovskite calcium zirconate powder. In Examples 13 to 16, relative to 100 parts by weight of a total weight (sum) of the raw materials in terms of chemical formula $(Ba_vCa_wSn_xTi_yZr_z)O_3$, 0.0049 parts by weight (Example 13), 0.0499 parts by weight (Example 14), 0.0999 parts by weight (Example 15), and 0.1199 parts by weight (Example 16) of magnesium oxide, respectively, were added to the raw material mixed powder in order to adjust the Mg content. Each of the resultant mixtures was dry-mixed by using a ball mill for 24 hours.

The average equivalent circle diameter and relative density of the piezoelectric material in each of the piezoelectric elements of Examples 2 to 16 were evaluated by the same method as in Example 1. The results are shown in Table 2. The results of composition analysis performed by the same method as in Example 1 are shown in Table 3. Of the Mg component, 0.0001 parts by weight was considered to be derived from the raw materials. The other metals of the composition after sintering were the same as the weighed composition with respect to the denoted effective digits. The other fourth sub-component was not detected. The results of measurement of average valence of Sn by the same method as in Example 1 and the values of xa and xb are shown in Table 3. The results of XPS measurement agreed with the result of Sn Mossbauer measurement. With any of the piezoelectric materials in the piezoelectric elements of Examples 2 to 16, only a peak corresponding to a tetragonal perovskite structure was observed as a single phase in X-ray diffraction analysis at room temperature (27° C.).

TABLE 1

| | Main component | | | | | First sub-component Mn [Parts by weight] | Second sub-component Bi [Parts by weight] | Third sub-component Mg [Parts by weight] |
|---|---|---|---|---|---|---|---|---|
| | Ba v | Ca w | Sn x | Ti y | Zr z | | | |
| Example 1 | 0.810 | 0.140 | 0.080 | 0.940 | 0.030 | 0.180 | 0.260 | — |
| Example 2 | 0.810 | 0.140 | 0.060 | 0.960 | 0.030 | 0.180 | 0.260 | — |
| Example 3 | 0.810 | 0.140 | 0.100 | 0.920 | 0.030 | 0.180 | 0.260 | — |
| Example 4 | 0.790 | 0.200 | 0.060 | 0.950 | 0.000 | 0.120 | 0.290 | — |
| Example 5 | 0.780 | 0.200 | 0.070 | 0.950 | 0.000 | 0.120 | 0.290 | — |
| Example 6 | 0.700 | 0.200 | 0.150 | 0.950 | 0.000 | 0.120 | 0.290 | — |
| Example 7 | 0.620 | 0.200 | 0.230 | 0.950 | 0.000 | 0.120 | 0.290 | — |
| Example 8 | 0.970 | 0.010 | 0.030 | 0.940 | 0.050 | 0.240 | 0.100 | — |
| Example 9 | 0.830 | 0.080 | 0.100 | 0.990 | 0.000 | 0.400 | 0.042 | — |
| Example 10 | 0.750 | 0.100 | 0.200 | 0.865 | 0.085 | 0.040 | 0.850 | — |
| Example 11 | 0.810 | 0.140 | 0.070 | 0.920 | 0.060 | 0.180 | 0.000 | — |
| Example 12 | 0.900 | 0.050 | 0.070 | 0.970 | 0.010 | 0.000 | 0.350 | — |
| Example 13 | 0.810 | 0.140 | 0.080 | 0.940 | 0.030 | 0.180 | 0.260 | 0.0049 |
| Example 14 | 0.810 | 0.140 | 0.080 | 0.940 | 0.030 | 0.180 | 0.260 | 0.0499 |
| Example 15 | 0.810 | 0.140 | 0.080 | 0.940 | 0.030 | 0.180 | 0.260 | 0.0999 |
| Example 16 | 0.810 | 0.140 | 0.080 | 0.940 | 0.030 | 0.180 | 0.260 | 0.1199 |
| Comparative Example 1 | 0.980 | 0.000 | 0.050 | 0.940 | 0.030 | 0.180 | 0.260 | — |
| Comparative Example 2 | 0.610 | 0.250 | 0.160 | 0.970 | 0.010 | 0.180 | 0.260 | — |
| Comparative Example 3 | 0.860 | 0.140 | 0.050 | 0.950 | 0.000 | 0.180 | 0.000 | — |
| Comparative Example 4 | 0.850 | 0.140 | 0.010 | 1.000 | 0.000 | 0.180 | 0.260 | — |
| Comparative Example 5 | 0.660 | 0.140 | 0.260 | 0.910 | 0.030 | 0.180 | 0.000 | — |
| Comparative Example 6 | 0.810 | 0.140 | 0.100 | 0.860 | 0.090 | 0.180 | 0.000 | — |

TABLE 2

| | Average equivalent circle diameter [μm] | Relative density [%] |
|---|---|---|
| Example 1 | 3.3 | 99.1 |
| Example 2 | 1.8 | 96.1 |
| Example 3 | 2.7 | 94.4 |
| Example 4 | 4.4 | 95.5 |
| Example 5 | 3.7 | 93.5 |
| Example 6 | 4.8 | 94.1 |
| Example 7 | 5.0 | 96.2 |
| Example 8 | 2.2 | 93.8 |
| Example 9 | 1.6 | 95.3 |
| Example 10 | 0.3 | 94.5 |
| Example 11 | 9.9 | 94.3 |
| Example 12 | 1.4 | 93.8 |
| Example 13 | 3.5 | 93.6 |

TABLE 2-continued

|  | Average equivalent circle diameter [μm] | Relative density [%] |
|---|---|---|
| Example 14 | 5.4 | 93.2 |
| Example 15 | 6.1 | 92.5 |
| Example 16 | 4.1 | 91.4 |
| Comparative Example 1 | 33.0 | 90.2 |
| Comparative Example 2 | 1.5 | 94.6 |
| Comparative Example 3 | 3.7 | 96.6 |
| Comparative Example 4 | 10.5 | 92.9 |
| Comparative Example 5 | 11.4 | 89.8 |
| Comparative Example 6 | 0.2 | 91.4 |

TABLE 3

|  | Average valence of Sn | Main component | | | | | | | First sub-component Mn [Parts by weight] | Second sub-component Bi [Parts by weight] | Third sub-component Mg [Parts by weight] |
|  |  | Ba v | Ca w | Sn x | Sn xa | Sn xb | Ti y | Zr z |  |  |  |
|---|---|---|---|---|---|---|---|---|---|---|---|
| Example 1 | 2.8 | 0.810 | 0.140 | 0.080 | 0.050 | 0.030 | 0.940 | 0.030 | 0.180 | 0.260 | 0.0001 |
| Example 2 | 2.3 | 0.810 | 0.140 | 0.060 | 0.050 | 0.010 | 0.960 | 0.030 | 0.180 | 0.260 | 0.0001 |
| Example 3 | 3.0 | 0.810 | 0.140 | 0.100 | 0.050 | 0.050 | 0.920 | 0.030 | 0.180 | 0.260 | 0.0001 |
| Example 4 | 3.7 | 0.790 | 0.200 | 0.060 | 0.010 | 0.050 | 0.950 | 0.000 | 0.120 | 0.290 | 0.0001 |
| Example 5 | 3.4 | 0.780 | 0.200 | 0.070 | 0.020 | 0.050 | 0.950 | 0.000 | 0.120 | 0.290 | 0.0001 |
| Example 6 | 2.7 | 0.700 | 0.200 | 0.150 | 0.100 | 0.050 | 0.950 | 0.000 | 0.120 | 0.290 | 0.0001 |
| Example 7 | 2.4 | 0.620 | 0.200 | 0.230 | 0.180 | 0.050 | 0.950 | 0.000 | 0.120 | 0.290 | 0.0001 |
| Example 8 | 2.7 | 0.970 | 0.010 | 0.030 | 0.020 | 0.010 | 0.940 | 0.050 | 0.240 | 0.100 | 0.0001 |
| Example 9 | 2.2 | 0.830 | 0.080 | 0.100 | 0.090 | 0.010 | 0.990 | 0.000 | 0.400 | 0.042 | 0.0001 |
| Example 10 | 2.5 | 0.750 | 0.100 | 0.200 | 0.150 | 0.050 | 0.865 | 0.085 | 0.040 | 0.850 | 0.0001 |
| Example 11 | 2.6 | 0.810 | 0.140 | 0.070 | 0.050 | 0.020 | 0.920 | 0.060 | 0.180 | 0.000 | 0.0001 |
| Example 12 | 2.6 | 0.900 | 0.050 | 0.070 | 0.050 | 0.020 | 0.970 | 0.010 | 0.000 | 0.350 | 0.0001 |
| Example 13 | 2.8 | 0.810 | 0.140 | 0.080 | 0.050 | 0.030 | 0.940 | 0.030 | 0.180 | 0.260 | 0.0050 |
| Example 14 | 2.8 | 0.810 | 0.140 | 0.080 | 0.050 | 0.030 | 0.940 | 0.030 | 0.180 | 0.260 | 0.0500 |
| Example 15 | 2.8 | 0.810 | 0.140 | 0.080 | 0.050 | 0.030 | 0.940 | 0.030 | 0.180 | 0.260 | 0.1000 |
| Example 16 | 2.8 | 0.810 | 0.140 | 0.080 | 0.050 | 0.030 | 0.940 | 0.030 | 0.180 | 0.260 | 0.1200 |
| Comparative Example 1 | 3.2 | 0.980 | 0.000 | 0.050 | 0.020 | 0.030 | 0.940 | 0.030 | 0.180 | 0.260 | 0.0001 |
| Comparative Example 2 | 2.3 | 0.610 | 0.250 | 0.160 | 0.140 | 0.020 | 0.970 | 0.010 | 0.180 | 0.260 | 0.0001 |
| Comparative Example 3 | 4.0 | 0.860 | 0.140 | 0.050 | 0.000 | 0.050 | 0.950 | 0.000 | 0.180 | 0.000 | 0.1200 |
| Comparative Example 4 | 2.0 | 0.850 | 0.140 | 0.010 | 0.010 | 0.000 | 1.000 | 0.000 | 0.180 | 0.260 | 0.0001 |
| Comparative Example 5 | 2.5 | 0.660 | 0.140 | 0.260 | 0.200 | 0.060 | 0.910 | 0.030 | 0.180 | 0.000 | 0.0001 |
| Comparative Example 6 | 3.0 | 0.810 | 0.140 | 0.100 | 0.050 | 0.050 | 0.860 | 0.090 | 0.180 | 0.000 | 0.0001 |

(Influence of Sintering Temperature)

Even when a piezoelectric material and piezoelectric element were formed by the same process as in Examples 1 to 16 except that the maximum temperature of sintering was each of 1200° C. and 1400° C., the composition after sintering was the same as the weighed composition, and a crystal structure had a perovskite-structure single phase. In addition, the average equivalent circle diameter was in a range of 0.3 μm to 10 μm and the relative density was 91.4% or more.

(Influence of Sn Raw Material)

A piezoelectric material and piezoelectric element were formed by the same process as in each of Example 1 except that a powder produced by reducing a commercial tin(IV) oxide powder (average particle diameter of 300 nm, purity of 99.9% or more) at 1200° C. in a hydrogen-nitrogen mixed gas atmosphere at an oxygen partial pressure of $1.0 \times 10^{-10}$ to $1.0 \times 10^{-12}$ MPa was used as a Sn raw material. The composition of the piezoelectric material after sintering was the same as the weighed composition, and a crystal structure had a perovskite-structure single phase. In addition, the average equivalent circle diameter was 2.9 μm, the relative density was 97.9%, and the average valence of Sn was 2.8.

(Influence of Other Production Method)

A metal oxide powder represented by the chemical formula $(Ba_{0.760}Ca_{0.140}Sn_{0.100})(Ti_{0.970}Zr_{0.030})O_3$ was synthesized. The production method was the same as that for the piezoelectric material of Example 1 except that the binder was not added, granulation was not performed, and only the resultant mixed powder was press-molded. In addition, the oxygen partial pressure in the electric furnace was $1.0 \times 10$ MPa, and $T_{max}$ was 1200° C. The resultant sintered body was polished to produce a metal oxide powder.

At the same tame, a metal oxide powder represented by the chemical formula $(Ba_{0.860}Ca_{0.140})(Ti_{0.910}Zr_{0.030}Sn_{0.060})O_3$ was synthesized. The production method was the same as the $(Ba_{0.760}Ca_{0.140}Sn_{0.100})(Ti_{0.970}Zr_{0.030})O_3$ powder described above except a feeding ratio, but art air atmosphere was used in the electric furnace.

The $(Ba_{0.760}Ca_{0.140}Sn_{0.100})(Ti_{0.970}Zr_{0.030})O_3$ powder and the $(Ba_{0.860}Ca_{0.140})(Ti_{0.910}Zr_{0.030}Sn_{0.060})O_3$ powder were mixed at an equimolar ratio and then dry-mixed by using a ball mill for 24 hours. As a result of measurement of the amount of Mg contained in the resultant mixed powder by ICP emission spectroscopy, 0.0001 parts by weight of Mg was contained relative to 100 parts by weight of the raw material powder. The mixed powder was granulated, molded, and sintered by the same methods as in Example 1 to produce a piezoelectric material and a piezoelectric element of the present invention. However, the maximum temperature of sintering was 1200° C. The composition of the piezoelectric material after sintering was substantially the same as the piezoelectric material of Example 1, the average equivalent circle diameter was 4.9 μm, the relative density was 93.9%, and the average valence of Sn was 2.8. The crystal structure was a perovskite structure single phase, but a diffraction peak corresponding to the structure was slightly broader than the X-ray diffraction peak of the piezoelectric material of Example 1.

Comparative Examples 1 to 6

A ceramic and element of Comparative Example 1 were formed by the same method as in Example 8, and a ceramic and element, of each of Comparative Examples 2 to 6 was formed by the same method as in Example 1. However, the weighed ratio of each of the components for forming comparative ceramic was as shown in Table 1. The average equivalent circle diameter and relative density of each of the comparative ceramics were evaluated by the same method as in Example 1. The results are shown in Table 2. The results of composition analysis performed by the same method as in Example 1 are shown in Table 3. Of the Mg component, 0.0001 parts by weight was considered to be derived from the raw materials. The other metals of the composition after sintering were the same as the weighed composition with respect to the denoted effective digits. The other fourth sub-component was not detected. The results of measurement of average valence of Sn by the same method as in Example 1 and the values of xa and xb are shown in Table 3. In Comparative Example 1, abnormal grain growth was observed in the produced ceramic, and the occurrence of cracks and defects in processing for forming the element indicated that mechanical strength is insufficient. With any one of the ceramics produced in Comparative Examples 2, 3, 4, and 6, only a peak corresponding to a tetragonal perovskite structure was observed as a single phase in X-ray diffraction analysis. However, the ceramics produced in Comparative Examples 1 and 5 contained a large amount of a non-perovskite-structure impurity phase (Sn-containing compound). The element produced in Comparative Example 5 could not be subjected to polarization because of low insulation, and thus electric characteristics thereof were not evaluated.

(Characteristic Evaluation of Piezoelectric Element and Comparative Element)

With respect to the piezoelectric elements, produced in Examples 1 to 16 and the elements produced in Comparative Examples 1 to 6, piezoelectric constant $d_{31}$ at room temperature (27° C.), mechanical quality factor $Q_m$ at room temperature, resistivity R at room temperature, depolarization temperature $T_d$, and a ratio of piezoelectric constant $d_{31}$ between before and after allowing to stand in a high-temperature environment were evaluated. The results are shown in Table 4. The element produced in Comparative Example 5 could not be subjected to polarization because of low resistivity, and thus only resistivity R is shown in Table 4.

The piezoelectric constant $d_{31}$ was determined by the resonance-antiresonance method at room temperature, and an absolute value thereof is described in the table. The mechanical quality factor $Q_m$ was determined by the resonance-antiresonance method at the same time as the piezoelectric constant. The resistivity R was measured by applying a direct-current voltage of 10 V between two opposed electrodes of the element and determined from a leak current 20 seconds after. When the resistivity is $1.0 \times 10^9$ Ω·cm or more and preferably $3.0 \times 10^{10}$ Ω·cm or more, the piezoelectric element is considered to have satisfactory insulation in practical use. The piezoelectric constant $d_{33}$ was used as an index for determining depolarization temperature $T_d$. The piezoelectric constant $d_{33}$ was measured by using a piezoelectric constant $d_{33}$ measuring meter (Alpha Corporation) based on the Berlincourt method. The element was placed on a hot plate kept at a predetermined temperature for 10 minutes and allowed to cool in the air. The piezoelectric constant $d_{33}$ of the element was measured at room temperature. The holding temperature was successively increased from 25° C. to 160° C. at an interval of 5° C., and the piezoelectric constant was repeatedly measured. The temperature at which the piezoelectric constant was less than 90% of the initial value was regarded as the depolarization temperature $T_d$. In order to evaluate a change in piezoelectric characteristics of the element by exposure to a high-temperature environment, an element in which piezoelectric constant $d_{31}$ had been measured was allowed to stand in a constant-temperature dryer of 85° C. for 24 hours and taken out from the dryer, and then piezoelectric constant $d_{31}$ at room temperature 24 hours after was measured to determine a change in piezoelectric constant before and after a heating test. Table 4 shows a ratio by percentage of piezoelectric constant after the high-temperature exposure test to piezoelectric constant before the high-temperature exposure test.

TABLE 4

|  | Piezoelectric constant $|d_{31}|$ [pm/V] | Mechanical quality factor $Q_m$ [—] | DC resistivity R [$10^9$ Ω · cm] | Depolarization temperature $T_d$ [° C.] | $|d_{31}|$ ratio before and after high-temperature test |
|---|---|---|---|---|---|
| Example 1 | 102 | 940 | 380 | 130 | 100% |
| Example 2 | 85 | 910 | 350 | 135 | 100% |
| Example 3 | 116 | 930 | 360 | 120 | 100% |
| Example 4 | 98 | 820 | 450 | 115 | 98% |
| Example 5 | 96 | 830 | 260 | 120 | 100% |
| Example 6 | 94 | 810 | 190 | 140 | 100% |
| Example 7 | 92 | 850 | 410 | 155 | 100% |
| Example 8 | 108 | 1100 | 690 | 110 | 96% |
| Example 9 | 70 | 1350 | 750 | 145 | 100% |
| Example 10 | 126 | 460 | 370 | 140 | 100% |
| Example 11 | 114 | 650 | 410 | 120 | 100% |
| Example 12 | 81 | 500 | 340 | 140 | 100% |
| Example 13 | 99 | 930 | 200 | 130 | 100% |
| Example 14 | 99 | 920 | 120 | 130 | 100% |
| Example 15 | 98 | 900 | 55 | 125 | 100% |
| Example 16 | 96 | 780 | 30 | 120 | 100% |

TABLE 4-continued

|  | Piezoelectric constant $|d_{31}|$ [pm/V] | Mechanical quality factor $Q_m$ [—] | DC resistivity R [$10^9$ Ω·cm] | Depolarization temperature $T_d$ [° C.] | $|d_{31}|$ ratio before and after high-temperature test |
|---|---|---|---|---|---|
| Comparative Example 1 | 39 | 160 | 2.6 | 65 | 23% |
| Comparative Example 2 | 47 | 660 | 35 | 120 | 100% |
| Comparative Example 3 | 67 | 450 | 42 | 90 | 89% |
| Comparative Example 4 | 52 | 690 | 48 | 135 | 100% |
| Comparative Example 5 | Not evaluated | Not evaluated | 0.0051 | Not evaluated | Not evaluated |
| Comparative Example 6 | 92 | 420 | 9.5 | 65 | 25% |

(Influence of Electrode Material)

Even when a piezoelectric element of the present invention was produced by the same process as in Examples 1 to 16 except that the electrodes was formed by baking silver paste, the characteristics were the same as the piezoelectric element of the present invention including gold electrodes.

Characteristics of Examples and Comparative Examples

The absolute value of piezoelectric constant $d_{31}$ of any one of the piezoelectric elements of Examples 1 to 16 was as large as 70 or more, and thus the piezoelectric elements were suitable for practical use as a piezoelectric device. The mechanical quality factor $Q_m$ of any one of the piezoelectric elements of Examples 1 to 16 was 460 or more, and thus the piezoelectric elements were suitable for practical use as a resonant piezoelectric device. The resistivity R of any one of the piezoelectric elements of Examples 1 to 16 was as large as $30 \times 10^9$ Ω·cm or more and thus the piezoelectric elements were suitable for practical use as a device producing piezoelectric strain under a high electric field. The depolarization temperature $T_d$ of any one of the piezoelectric elements of Examples 1 to 16 was as high as 110° C. or more, and the piezoelectric constant ratio between before and after the high-temperature test was as high as 96% or more.

The element of Comparative Example 1 did not contain Ca which promotes A-site solid solution of Sn, and thus an impurity phase was present. Therefore, piezoelectric constant $d_{31}$ was an unsatisfactory value, mechanical quality factor $Q_m$ was small, resistivity R was low, and deterioration in performance occurred in the high-temperature test. Also, ceramic not containing Ca has an orthorhombic structure-tetragonal structure phase transition temperature close to room temperature, and thus a change in piezoelectric characteristics with temperature is large, thereby causing difficulty in device design.

The element of Comparative Example 2 contained excessive Ca and showed deterioration in piezoelectric characteristics.

The element of Comparative Example 3 contained Sn with an average valence of 4 and the effect of increasing the depolarization temperature was not obtained. Therefore, deterioration in performance due to the high-temperature test occurred.

The element of Comparative Example 4 contained Sn having an average valence of 2 and showed unsatisfactory piezoelectric characteristics.

The element of Comparative Example 5 contained excessive Sn and showed deterioration in resistivity.

The element of Comparative Example 6 contained excessive Zr and thus showed a low depolarization temperature and the occurrence of deterioration in performance due to the high-temperature test.

(Piezoelectric Element Having Second Region)

Example 17

The piezoelectric element shown in FIGS. 1B and 1C was produced by using the same piezoelectric material as in Example 1. The piezoelectric material contained a metal oxide which can be represented by chemical formula $(Ba_{0.760}Ca_{0.140}Sn_{0.080}Ti_{0.970}Zr_{0.030})O_3$ or $(Ba_{0.810}Ca_{0.140}Sn_{0.050})(Sn_{0.30}Ti_{0.940}Zr_{0.030})O_3$ as a main component, and 0.180 parts by weight of Mn as the first sub-component, 0.260 parts by weight of Bi as the second sub-component, and 0.0001 parts by weight of Mg as the third sub-component relative to 100 parts by weight of the main component. The piezoelectric material was processed to a doughnut disk shape having an outer diameter of 70 mm, an inner diameter of 55 mm, and a thickness of 0.5 mm, and gold electrodes having a thickness of 400 nm were formed on the front and back surfaces of the piezoelectric material by a DC sputtering method. In addition, titanium was deposited to form an adhesive layer of 30 nm between each of the electrodes and the piezoelectric material. The electrode on the front surface was patterned by using a metal mask as shown in FIG. 1B. The element was placed on a hot plate of a surface temperature of 110° C. to 140° C., and polarization was performed by applying an electric field of 1.2 kV/mm between the electrodes for 30 minutes. In this case, a positive electric field was applied to electrode portions with a "+" symbol in FIG. 1B, and a negative electric field was applied to electrode portions with a "−" symbol in FIG. 1B, thereby producing a piezoelectric element of the present invention having a first region and a second region having remanent polarization with different polarities.

The piezoelectric element was cut along the electrode pattern on the front surface and evaluated by the same method as in Example 1. As a result, the same characteristics as in Example 1 were observed except that the direction of piezoelectric constant varies between positive and negative directions in respective regions.

Next, a multilayered piezoelectric element of the present invention was produced.

(Multilayered Piezoelectric Element)

Example 18

Raw materials corresponding to the composition, $(Ba_{0.810}Ca_{0.140}Sn_{0.080}Ti_{0.940}Zr_{0.030})O_3$ of the general formula $(B_vCa_wSn_xTi_yZ_z)O_3$ wherein $v=0.810$, $w=0.140$, $x=0.080$, $y=0.940$, and $z=0.030$ were weighed according to procedures described below.

A commercial tin(II) oxide powder (average particle diameter of 600 nm, purity of 99.5% or more) was used as a Sn raw material, and a barium titanate powder (average particle diameter of 100 nm, purity of 99.999% or more) having a perovskite structure produced by a solid-phase method, a perovskite calcium titanate powder (average particle diameter of 300 nm, purity of 99.999% or more), and a perovskite calcium zirconate powder (average particle diameter of 300 nm, purity of 99.999% or more) were used as Ba, Ca, Ti, and Zr raw materials and weighed so that the composition ratios of Ba, Ca, Sn, Ti, and Zr satisfied $(Ba_{0.810}Ca_{0.140}Sn_{0.080}Ti_{0.940}Zr_{0.030})O_3$. Manganese dioxide containing 0.180 parts by weight of Mn as the first sub-component in terms of metal relative to 100 parts by weight of the composition $(Ba_{0.810}Ca_{0.140}Sn_{0.080}Ti_{0.940}Zr_{0.030})O_3$ was weighed. Similarly, bismuth dioxide containing 0.260 parts by weight of Bi as the second sub-component in terms of metal was weighed.

Then, a polyvinyl butyral (PVB) binder was added to the resultant mixed powder and mixed, and then formed into a sheet by a doctor blade method to form a green sheet having a thickness of 50 μm.

A conductive paste for internal electrodes, was printed on the green sheet. An Ag 70%-Pd 30% alloy (Ag/Pd=2.33) paste was used as the conductive paste. Nine green sheets on which the conductive paste has been applied were laminated. The resultant laminate was placed in an atmosphere-changeable electric furnace and first heated at 400° C. in the air atmosphere to remove the organic binder component. Next, the introduced gas was changed to a hydrogen-nitrogen mixed gas in the same electric furnace, the oxygen partial pressure was controlled to $1.0\times10^{-8}$ MPa, and then the laminate was maintained at the maximum temperature ($T_{max}$) of 1380° C. for 5 hours. Next, the temperature was decreased to 1100° C. at the same oxygen partial pressure, the oxygen partial pressure was increased to $3.0\times10^{-4}$ MPa, and then the temperature was decreased to 300° C., producing a sintered body.

The composition of a piezoelectric material portion of the sintered body obtained as described above was evaluated by ICP emission spectrometry. As a result, it was found that the piezoelectric material portion contains a metal oxide which can be represented by the chemical formula $(Ba_{0.760}Ca_{0.140}Sn_{0.080}Ti_{0.970}Zr_{0.030})O_3$ or $(Ba_{0.810}Ca_{0.140}Sn_{0.050})(Sn_{0.030}Ti_{0.940}Zr_{0.030})O_3$ as a main component, and 0.180 parts by weight of Mn as the first sub-component, 0260 parts by weight of Bi as the second sub-component, and 0.0001 parts by weight of Mg as the third sub-component relative to 100 parts by weight of the main component. The average valence of Sn determined by the same method as in Example 1 was 2.8.

The sintered body was cut to a size of 10 mm×2.5 mm and then the side surfaces were polished. Then, a pair of external electrodes (first electrode and second electrode) for alternately short-circuiting internal electrodes were formed by Au sputtering, thereby forming a multilayered piezoelectric element as shown in FIG. 2B.

The multilayered piezoelectric element included nine piezoelectric material layers and eight internal electrodes.

As a result of observation of the internal electrodes of the resultant multilayered piezoelectric element, the electrode material Ag—Pd and the piezoelectric material were alternately formed.

Before evaluation of piezoelectricity, polarization of a sample was performed. Specifically, the sample was heated to 100° C. to 150° C. on a hot plate, a voltage of 1.4 kV/mm was applied between the first and second electrodes for 30 minutes, and then the sample was cooled to room temperature while the voltage was applied.

As a result of evaluation of piezoelectricity of the resultant multilayered piezoelectric element, the element having sufficient, insulation and good piezoelectric characteristics equivalent to those of the piezoelectric element of Example 1 could be obtained. Also, it was confirmed that the piezoelectric material layers have alternate directions of remanent polarization in the lamination direction.

Example 19

A conductive paste for internal electrodes was printed on a green sheet formed by the same method as in Example 18. A Ni paste was used as the conductive paste. Nine green sheets on which the conductive paste had been applied were laminated and heat-bonded.

A sintered body was produced by the same firing process as in Example 18. The composition and valence of Sn in the piezoelectric material portion of the sintered body were the same as in Example 18.

The resultant sintered body was cut so a size of 10 mm×2.5 mm and then the side surfaces were polished. Then, a pair of external electrodes (first electrode and second electrode) for alternately short-circuiting internal electrodes were formed by Au sputtering, thereby forming a multilayered piezoelectric element as shown in FIG. 2B.

As a result of observation of the internal electrodes of the resultant multilayered piezoelectric element, the electrode material (electrode layers) Ni and the piezoelectric material layers were alternately formed. The multilayered piezoelectric element was heated to 80° C. on a hot plate, a voltage of 4.0 kV/mm was applied between the first and second electrodes for 30 minutes, and then the element was cooled to room temperature while the voltage was applied.

As a result of evaluation of piezoelectricity of the resultant multilayered piezoelectric element, the element having sufficient insulation and good piezoelectric characteristics equivalent to those of the piezoelectric element of Example 1 could be obtained. Also, it was confirmed that piezoelectric material layers have alternate directions of remanent polarization in the lamination direction.

Comparative Example 7

A multilayered piezoelectric element was produced by the same process as in Example 18. However, the internal electrodes were composed of an Ag 95%-Pd 5% alloy (Ag/Pd=19).

As a result of observation of the internal electrodes with a scanning electron microscope, the internal electrodes were dotted in an island form due to melting. Further, the alloy electrodes were reduced to significantly degrade conductivity. Therefore, polarization could not be performed because of non-conduction of the internal electrodes. Therefore, the piezoelectric constant could not be measured.

Comparative Example 8

A multilayered piezoelectric element was produced by the same process as in Comparative Example 5. However, the internal electrodes were composed of an Ag 5%-Pd 95% alloy (Ag/Pd=0.05).

As a result of observation of the internal electrodes with a scanning electron microscope, sintering of the electrode material Ag—Pd was insufficient. Therefore, polarization could not be performed because of non-conduction of the internal electrodes. Therefore, the piezoelectric constant could not be measured.

Example 20

A liquid discharge head shown in FIGS. 3A and 3B was produced by using the piezoelectric element of Example 1. Ink discharge according to an input electric signal was confirmed.

Example 21

A liquid discharge apparatus shown in FIG. 4 was produced by using the liquid discharge head of Example 20. Ink discharge according to an input electric signal was confirmed on a transfer member.

Example 22

An ultrasonic motor shown in FIG. 6A was produced by using the piezoelectric element of Example 1. Rotation of the motor according to the alternating voltage applied was confirmed.

Example 23

An optical apparatus shown in FIGS. 7A and 7B was produced by using the ultrasonic motor of Example 22. An auto-focus operation according to the alternating voltage applied was confirmed.

Example 24

A dust removing apparatus shown in FIGS. 9A and 9B was produced by using the piezoelectric element of Example 1. Plastic beads were scattered, and an alternating voltage was applied. As a result, a good rate of dust removal was confirmed.

Example 25

An image pick-up apparatus shown in FIG. 12 was produced by using the dust removing apparatus of Example 24. As a result of operation, dust on a surface of the image pick-up unit was satisfactorily removed, thereby producing an image without dust and defect.

Example 26

An electronic apparatus shown in FIG. 14 was produced by using the piezoelectric element of Example 1. A speaker operation according to the alternating voltage applied was confirmed.

Example 27

A liquid discharge head shown in FIGS. 3A and 3B was produced by using the multilayered piezoelectric element of Example 18. Ink discharge according to an input electric signal was confirmed.

Example 28

A liquid discharge apparatus shown in FIG. 4 was produced by using the liquid discharge head of Example 27. Ink discharge according to an input electric signal was confirmed on a recording medium.

Example 29

An ultrasonic motor shown in FIG. 6A was produced by using the multilayered piezoelectric element of Example 18. Rotation of the motor according to the alternating voltage applied was confirmed.

Example 30

An optical apparatus shown in FIGS. 7A and 7B was produced by using the ultrasonic motor of Example 29. An auto-focus operation according to the alternating voltage applied was confirmed.

Example 31

A dust removing apparatus shown in FIGS. 9A and 9B was produced by using the multilayered piezoelectric element of Example 18. Plastic beads were scattered, and an alternating voltage was applied. As a result, a good rate of dust removal was confirmed.

Example 32

An image pick-up apparatus shown in FIG. 12 was produced by using the dust removing apparatus of Example 31. As a result of operation, dust on a surface of the image pick-up unit was satisfactorily removed, thereby producing an image without dust and defect.

Example 33

An electronic apparatus shown in FIG. 14 was produced by using the multilayered piezoelectric element of Example 18. A speaker operation according to the alternating voltage applied was confirmed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

INDUSTRIAL APPLICABILITY

A piezoelectric material and piezoelectric element of the present invention have a high piezoelectric constant over a wide operating temperature region. Also, the piezoelectric material and piezoelectric element do not contain lead and thus have little load on the environments. Therefore, the piezoelectric element of the present invention can be used, without a problem, for piezoelectric apparatuses such as a liquid discharge head, a liquid discharge apparatus, an ultrasonic motor, an optical apparatus, art oscillatory apparatus, a dust removing apparatus, art image-pickup apparatus, and an electronic apparatus.

The invention claimed is:

1. A piezoelectric material comprising a perovskite-type metal oxide represented by general formula (1), wherein the average valence of Sn contained in the general formula (1) is between 2.2 and 3.7:

$$(Ba_vCa_wSn_xTi_yZr_z)O_3, \text{ where } 0.620 \leq v \leq 0.970,$$
$$0.010 \leq w \leq 0.200, 0.030 \leq x \leq 0.230, 0.865 \leq y \leq 0.990,$$
$$0 \leq z \leq 0.085, \text{ and } 1.986 \leq v+w+x+$$
$$y+z \leq 2.100. \quad \text{General Formula (1)}$$

2. The piezoelectric material according to claim 1, wherein the piezoelectric material contains 0.04 parts by weight or more and 0.40 parts by weight or less of Mn in terms of metal relative to 100 parts by weight of the metal oxide.

3. The piezoelectric material according to claim 1, wherein the piezoelectric material contains 0.850 parts by weight or less of Bi in terms of metal relative to 100 parts by weight of the metal oxide.

4. The piezoelectric material according to claim 1, wherein the piezoelectric material contains 0.10 parts by weight or less of Mg in terms of metal relative to 100 parts by weight of the metal oxide.

5. The piezoelectric material according to claim 1, wherein the depolarization temperature is 120° C. or more.

6. The piezoelectric material according to claim 1, wherein crystal grains constituting the piezoelectric material have an average equivalent circle diameter of 0.3 μm or more and 10 μm or less.

7. The piezoelectric material according to claim 1, wherein the piezoelectric material has a relative density of 91.4% or more and 100% or less.

8. A piezoelectric element comprising:
a first electrode;
a piezoelectric material portion; and
a second electrode,
wherein a piezoelectric material constituting the piezoelectric material portion is the piezoelectric material according to claim 1.

9. The piezoelectric element according to claim 8, wherein a portion or the entire of the piezoelectric material portion has remanent polarization in a region held between the first electrode and the second electrode.

10. A multilayered piezoelectric element comprising:
a plurality of piezoelectric material layers; and
a plurality of electrode layers containing internal electrodes, the piezoelectric material layers and the electrode layers being alternately laminated,
wherein the piezoelectric material layers are composed of the piezoelectric material according to claim 1.

11. The multilayered piezoelectric element according to claim 10, wherein each of the piezoelectric material layers has a region held by the electrode layers and partially or entirely having remanent polarization.

12. The multilayered piezoelectric element according to claim 11, wherein of the plurality of piezoelectric material layers, any desired piezoelectric material layer and the adjacent piezoelectric material layer have opposite directions of remanent polarization in the lamination direction.

13. The multilayered piezoelectric element according to claim 10, wherein the internal electrodes contain Ag and Pd, and a ratio M1/M2 of the content weight M1 of Ag to the content weight M2 of Pd is $0.25 \leq M1/M2 \leq 4.0$.

14. The multilayered piezoelectric element according to claim 10, wherein the internal electrodes contain at least one of Ni and Cu.

15. A liquid discharge head comprising:
a liquid chamber including a vibration portion in which the piezoelectric element according to claim 8 is disposed; and
a discharge port communicating with the liquid chamber.

16. A liquid discharge apparatus comprising:
a stage configured to receive an object; and
the liquid discharge head according to claim 15.

17. An ultrasonic motor comprising;
a vibrating body in which the piezoelectric element according to claim 8 is disposed; and
a moving body in contact with the vibrating body.

18. An optical apparatus comprising the ultrasonic motor according to claim 17 provided on a drive unit.

19. An oscillatory apparatus comprising a vibrating body in which the piezoelectric element according to claim 8 is disposed on a diaphragm.

20. A dust removing apparatus comprising a vibrating portion provided with the oscillatory apparatus according to claim 19.

21. An image pick-up apparatus comprising:
the dust removing apparatus according to claim 20; and
an image pick-up element unit,
wherein a diaphragm of the dust removing apparatus is provided on the light-receiving surface side of the image pick-up element unit.

22. An electronic apparatus comprising a piezoelectric acoustic component provided with the piezoelectric element according to claim 8.

23. A liquid discharge head comprising:
a liquid chamber including a vibration portion in which the multilayered piezoelectric element according to claim 10 is disposed; and
a discharge port communicating with the liquid chamber.

24. A liquid discharge apparatus comprising:
a stage configured to receive an object; and
the liquid discharge head according to claim 23.

25. An ultrasonic motor comprising;
a vibrating body in which the multilayered piezoelectric element according to claim 10 is disposed; and
a moving body in contact with the vibrating body.

26. An optical apparatus comprising the ultrasonic motor according to claim 25 provided on a drive unit.

27. An oscillatory apparatus comprising a vibrating body in which the multilayered piezoelectric element according to claim 10 is disposed on a diaphragm.

28. A dust removing apparatus comprising a vibrating portion provided with the oscillatory apparatus according to claim 27.

29. An image pick-up apparatus comprising:
the dust removing apparatus according to claim 28; and
an image pick-up element unit,
wherein a diaphragm of the dust removing apparatus is provided on the light-receiving surface side of the image pick-up element unit.

30. An electronic apparatus comprising a piezoelectric acoustic component provided with the multilayered piezoelectric element according to claim 10.

* * * * *